United States Patent [19]
Itano et al.

[11] Patent Number: 5,835,201
[45] Date of Patent: Nov. 10, 1998

[54] ORIGINAL HOLDER ADAPTABLE FOR BOTH LATERALLY LONG AND VERTICALLY LONG IMAGES

[75] Inventors: Yoshiharu Itano; Kunihiko Segawa, both of Tenjinkitamachi, Japan

[73] Assignee: Dainippon Screen Mfg. Co., Ltd., Kyoto, Japan

[21] Appl. No.: 579,134

[22] Filed: Dec. 27, 1995

[30] Foreign Application Priority Data

Dec. 27, 1994 [JP] Japan .................................. 6-338724
Mar. 1, 1995 [JP] Japan .................................. 7-068823

[51] Int. Cl.$^6$ .............................. G03B 27/62; H04N 1/04
[52] U.S. Cl. .............................. 355/75; 206/455; 358/498
[58] Field of Search ................................ 355/72, 75, 122, 355/123, 128; 40/364; 206/455, 456; 358/497, 498

[56] References Cited

U.S. PATENT DOCUMENTS

| | | | |
|---|---|---|---|
| 4,980,781 | 12/1990 | Yamamoto et al. | 355/75 X |
| 5,073,829 | 12/1991 | Katsuta et al. | 358/498 |
| 5,157,504 | 10/1992 | Shiraishi et al. | 358/498 X |
| 5,301,043 | 4/1994 | Ichikawa | 358/498 |
| 5,374,975 | 12/1994 | Amat | 355/75 |
| 5,592,258 | 1/1997 | Hashizume et al. | 355/75 X |

FOREIGN PATENT DOCUMENTS

| | | |
|---|---|---|
| 0 169967 A3 | 2/1986 | European Pat. Off. . |
| 2-226244 | 9/1990 | Japan . |
| 2195035 | 3/1988 | United Kingdom . |

*Primary Examiner*—Fred L. Braun
*Attorney, Agent, or Firm*—Lowe, Price, LeBlanc & Becker

[57] ABSTRACT

An original holder of the present invention can be inserted in a plurality of different directions into a flat bed scanning-type image reading apparatus. This structure allows both a laterally long image and a vertically long image to be promptly displayed as an erecting image without any specific operations. An original holder (10) embodying the invention includes a lower frame (12) and an upper frame (14), which are joined with each other to allow free opening and closing. The lower frame (12) and the upper frame (14) respectively have inner openings (12W,14W). The original holder (10) holds an original P in such a manner that the periphery of the original P is clamped between the lower frame (12) and the upper frame (14) and that the original P is observable through the openings (12W,14W). The original holder 10 has a substantially square shape. Two guide grooves (16,18) are formed along perpendicular sides on a rear face of the lower frame (12) of the original holder (10), so as to restrict the insertion of the original holder (10) to two directions.

11 Claims, 23 Drawing Sheets

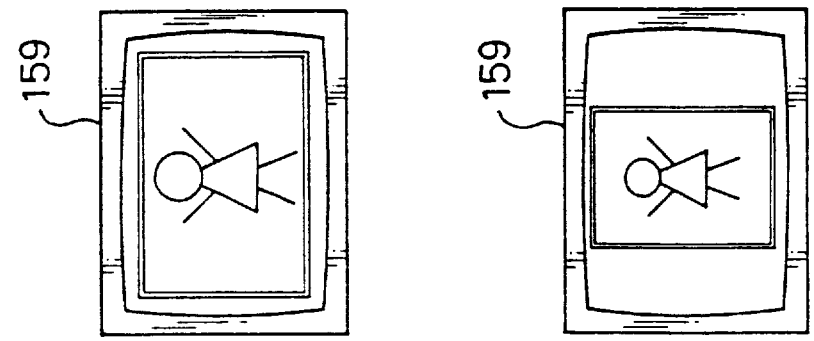
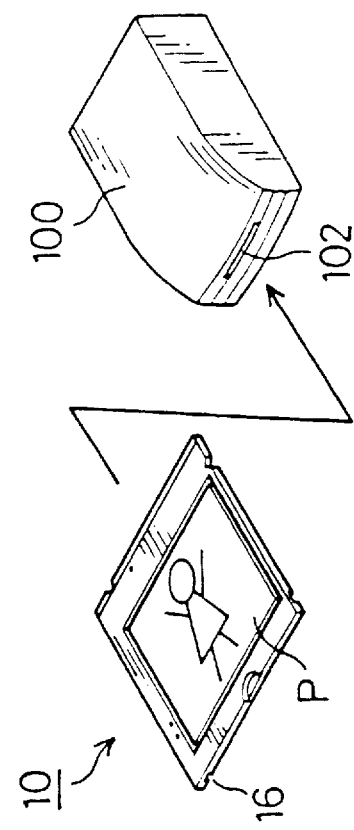
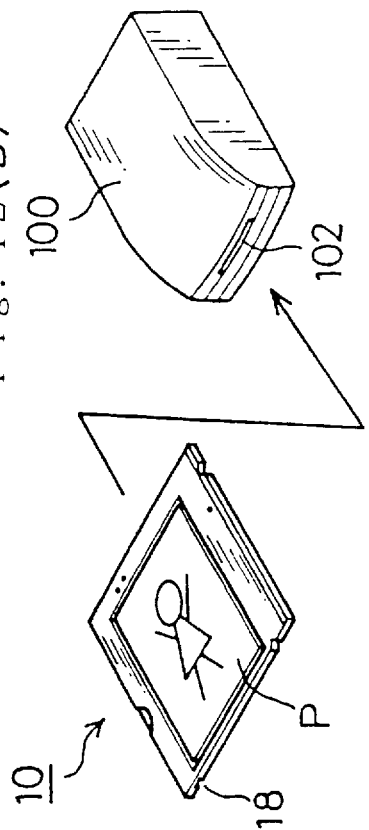

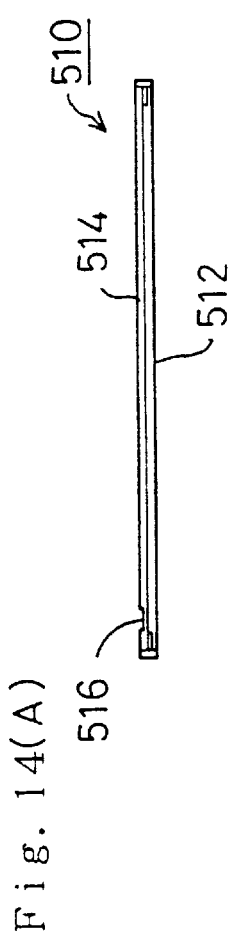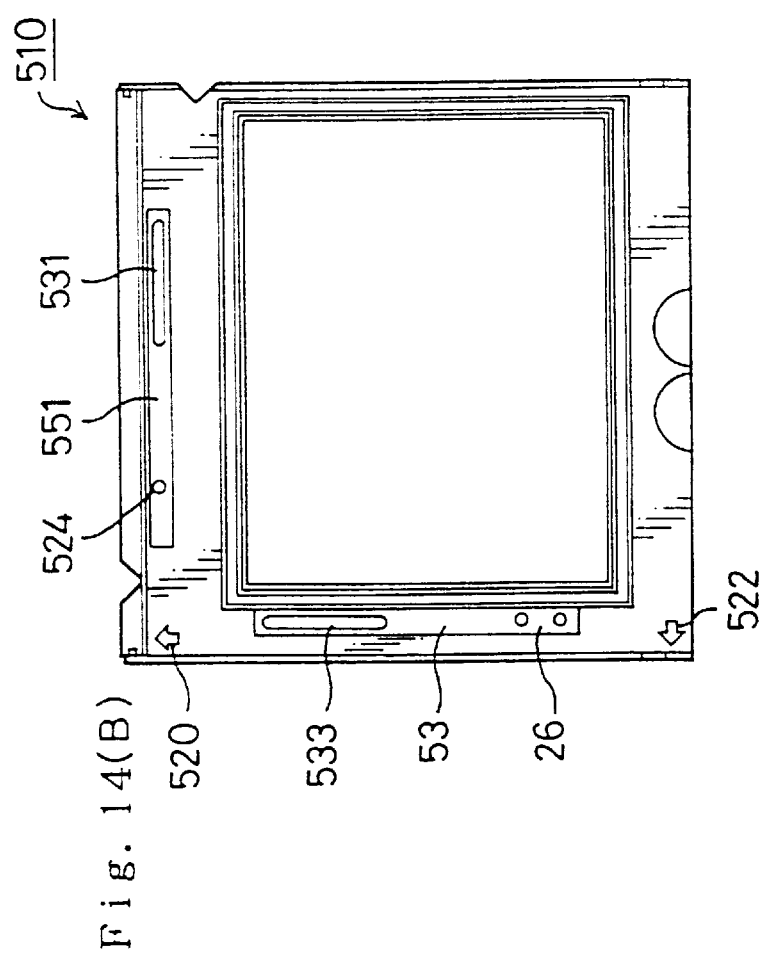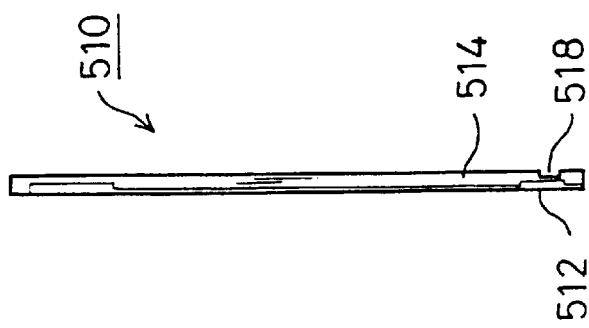

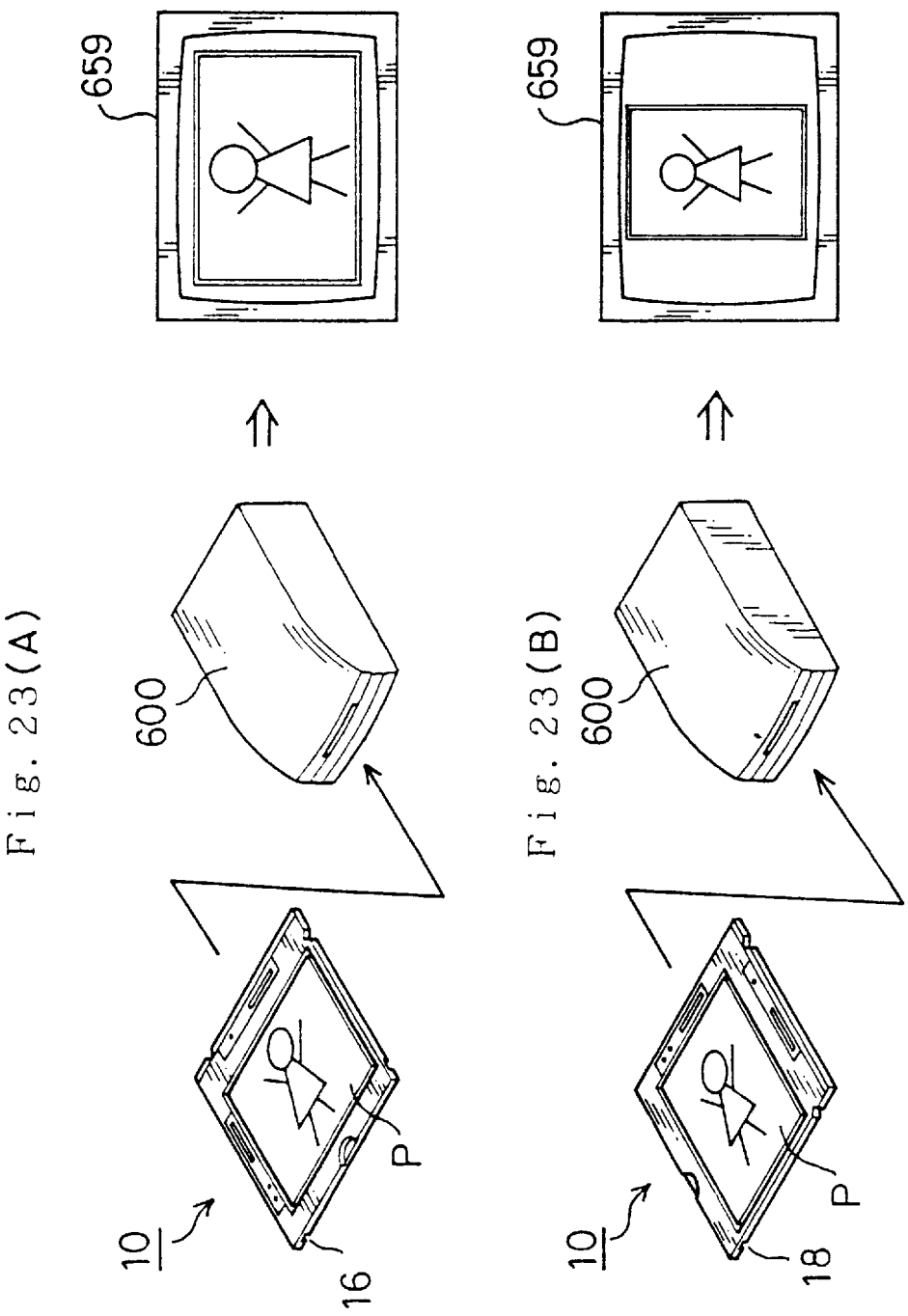

ORIGINAL HOLDER ADAPTABLE FOR BOTH LATERALLY LONG AND VERTICALLY LONG IMAGES

BACKGROUND OF THE INVENTION

1. Field of the Invention

The present invention relates to an original holder adaptable to be inserted into an image reading apparatus.

2. Description of the Related Art

FIG. 1 is a side view schematically illustrating the internal structure of a typical flat bed scanning-type image reading apparatus 900. In the flat bed scanning-type image reading apparatus 900, an original holder 904 inserted into a slot 902 is supported and horizontally shifted to a predetermined position by a movable table 905. A light source 906, for example, a fluorescent lamp, is disposed below the original holder 904 set at the predetermined position. Light emitted from the light source 906 is transmitted by an original held in the original holder 904 and enters linear charge-coupled devices 912 with R (red), G (green), and B (blue) filters via a folded mirror 908 and a lens 910 to be converted to electric signals. An image on the original held in the original holder 904 is accordingly input as electric signals into the flat bed scanning-type image reading apparatus 900.

A conventional original holder includes a lower frame and an upper frame which are joined with each other to allow free opening and closing. A transparent original, such as a film, is held between the lower frame and the upper frame. The conventional original holder generally has an oblong shape and is inserted in a specified direction into the slot 902 of the flat bed scanning-type image reading apparatus 900.

As long as an original P is held at predetermined position and orientation by the original holder 904, the image obtained by the flat bed scanning-type image reading apparatus 900 always has the same directional property. When the top and bottom sides of the original P are located along the longitudinal sides of the original holder 904 as shown in FIG. 2(A), for example, the flat bed scanning-type image reading apparatus 900 gives an erecting image as displayed on a CRT 920. When the left and right sides of the original P are located along the longitudinal sides of the original holder 904 as shown in FIG. 2(B), on the other hand, the flat bed scanning-type image reading apparatus 900 gives an image rotated by 90 degrees from the erecting image as displayed on the CRT 920.

Proposed techniques to display the obtained, 90 degree-rotated image in a correct orientation as an erecting image involve a structure of electrically rotating the obtained image and another structure of mechanically rotating the original holder by means of a rotary table to rotate the obtained image.

The former structure of electrically rotating the obtained image requires a relatively long time for rotating an input image of complicated profile to display the image in a correct orientation as an erecting image.

The latter structure of mechanically rotating the obtained image requires rotating means, such as a rotary table, disposed in the flat bed scanning-type image reading apparatus, thereby making the image reading apparatus rather bulky.

In both the former structure and the latter structure, the operator should instruct how many degrees the obtained image is to be rotated. This worsens the operating properties of the image reading apparatus.

It is preferable that the image reading apparatus for receiving the original holder can automatically read discriminative information indicating the type of the original held in the original holder or the identification number given to the original holder. One proposed structure involves a plurality of apertures arranged in the original holder to indicate the discriminative information. Namely arrays of the plural apertures coded by combinations of existence or non-existence of the respective apertures specify the discriminative information.

In one typical structure, actual perforation in the original holder determines the existence or non-existence of each aperture. Another proposed structure, for example, as disclosed in the U.S. Pat. No. 5,301,043, forms a plurality of apertures in each original holder and covers part of the plural apertures by means of a seal or the like to determine the combination of existence or non-existence of the respective apertures.

The structure of forming a plurality of apertures in each original holder can not give various pieces of discriminative information to one original holder. The alternative structure of forming a plurality of apertures in each original holder and covering part of the apertures by a seal has a drawback, that is, a limited number of apertures. For example, eight apertures can define only up to 256 pieces of discriminative information, thereby having insufficient general purpose properties.

Any of the known structures requires forming a plurality of apertures in the original holder, thereby complicating the manufacturing process and undesirably increasing the manufacturing cost.

SUMMARY OF THE INVENTION

One object of the present invention is thus to allow both a laterally long image and a vertically long image to be promptly displayed as an erecting image without any specific operations but only by inserting an original holder in an appropriate direction into an image reading apparatus.

Another object is to specify a predetermined piece of discriminative information by widely applicable means, thereby simplifying the manufacturing process and reducing the manufacturing cost.

The above and the other related objects are realized by an original holder adaptable to be inserted into an image reading apparatus comprising restriction means of a predetermined shape for restricting insertion of the original holder into the image reading apparatus, which comprises:

a pair of support members having a substantially square shape and an opening, the pair of support members adaptable to hold an original therebetween when the pair of support members are in a closed state; and a plurality of corresponding engagement means, provided to the pair of support members, for restricting insertion directions of the original holder into the image reading apparatus in cooperation with the restriction means, the plurality of corresponding engagement means having a rotational symmetry by integral multiples of 90 degrees, each the corresponding engagement means having a specified shape not interfering with the restriction means.

The original holder has a substantially square shape and comprises a plurality of corresponding engagement means having a rotational symmetry by integral multiples of 90 degrees. This allows the original holder to be inserted in two or more directions into the image reading apparatus.

The structure of the invention gives an image of desired direction according to the insertion direction of the original holder into the image reading apparatus. Insertion of the original holder in an appropriate direction into the image reading apparatus allows both a laterally long image and a vertically long image to be promptly displayed as an erecting image without any specific operations.

It is preferable that each corresponding engagement means of the original holder comprises a groove engageable with the projection member functioning as the restriction means.

The projection member formed in the image reading apparatus is received by and fitted in the groove formed on the original holder.

According to one preferable structure, the original holder further comprises a plurality of marks indicating the insertion directions, the plurality of marks having a rotational symmetry by integral multiples of 90 degrees.

This structure allows the plurality of marks to be read by only one sensor disposed in the image reading apparatus. The image reading apparatus reads the mark indicating the insertion direction of the original holder into the image reading apparatus and automatically sets a scanned range corresponding to the insertion direction. This structure improves the scanning rate of the image reading apparatus.

Each mark may comprise a light-transmitting indicator formed at the pair of support members to indicate each of the insertion directions.

The above objects are also realized by another original holder for holding an original scanned by an image reading apparatus. The original holder comprises:

first and second support members adaptable to hold an original therebetween, the first support member having a slit, the second support member having a light-transmitting part adaptable to transmit through the slit; and a slit cover sheet adaptable to be attached to the slit to shield a part of the slit to make a light transmitting pattern, so as to specify a piece of discriminative information with the light transmitting pattern.

Detecting the light transmitting pattern of the slit partly covered by the slit cover sheet specifies a predetermined piece of discriminative information. Perforation of only one slit allows specification of plural pieces of information, and the quantities of data are arbitrarily increased by varying the light transmitting pattern. The original holder requires only one slit for the purpose of specifying the discriminative information. This simplifies the manufacturing process and effectively reduces the manufacturing cost.

According to one preferable structure, the first and second support members have a substantially square shape, the first support member comprising plural sets of the slit and the slit cover sheet, the plural sets of the slit and the slit cover sheet having a rotational symmetry by integral multiples of 90 degrees.

The substantially square shape of the first and second support members allows the original holder to be inserted in two or more directions into the image reading apparatus. The first support member comprises plural sets of the slit and the slit cover sheet having a rotational symmetry by integral multiples of 90 degrees. This structure allows the light transmitting pattern of the slit to be detected irrespective of the insertion direction of the original holder into the image reading apparatus. This simplifies the structure of the image reading apparatus.

It is preferable that the slit cover sheet comprises a shielding part including a plurality of black areas printed on a transparent sheet.

In accordance with one preferable application, the piece of discriminative information includes an identification number given to the original holder.

In accordance with another preferable application, the piece of discriminative information represents a insertion direction of the original holder into the image reading apparatus.

These and other objects, features, aspects, and advantages of the present invention will become more apparent from the following detailed description of the preferred embodiments with the accompanying drawings.

BRIEF DESCRIPTION OF THE DRAWINGS

FIGS. 12(A) and 12(B) show resulting images displayed when the original holder 10 is inserted into the flat bed scanner 100;

FIGS. 14(A)–14(C) are plan, front, and side views illustrating the original holder 510 in a closed state;

FIGS. 23(A) and 23(B) show resulting images displayed when the original holder 510 is inserted into the flat bed scanner 600;

DESCRIPTION OF THE PREFERRED EMBODIMENT

Figure 3:
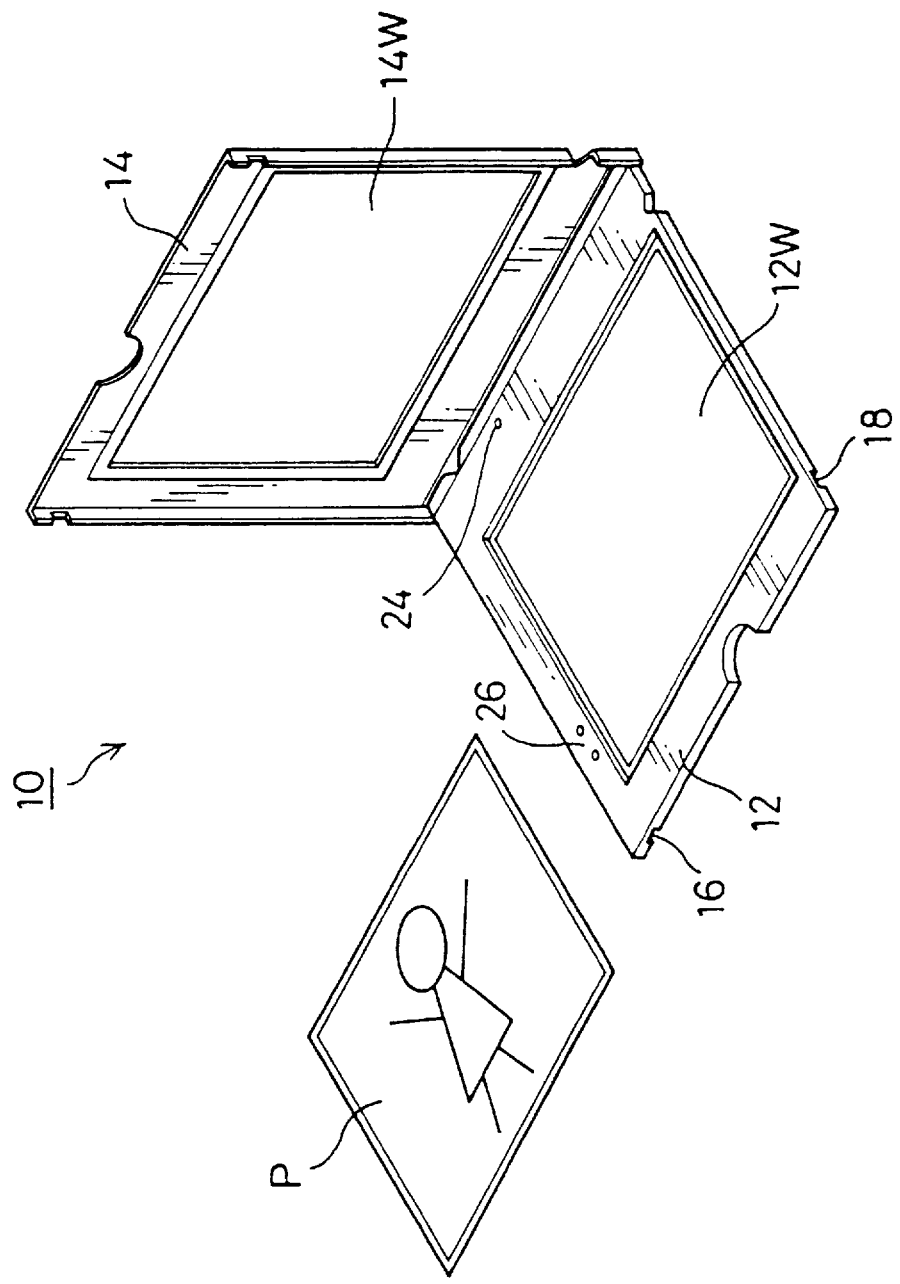
FIG. 3 is a perspective view illustrating an original holder 10 as a first embodiment according to the present invention, in an open state.
Figure 4A:
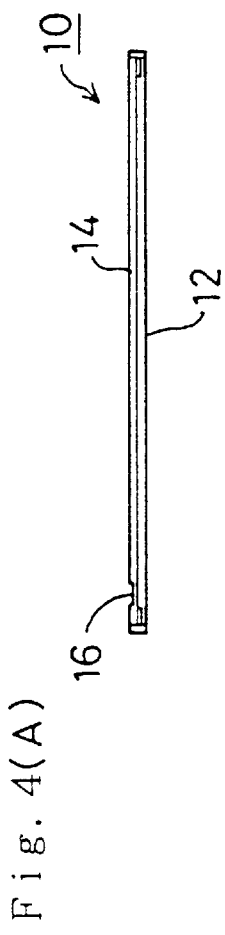
FIGS. 4A–4C are plan, front, and side views illustrating the original holder 10 in a closed state.
Figure 4B:
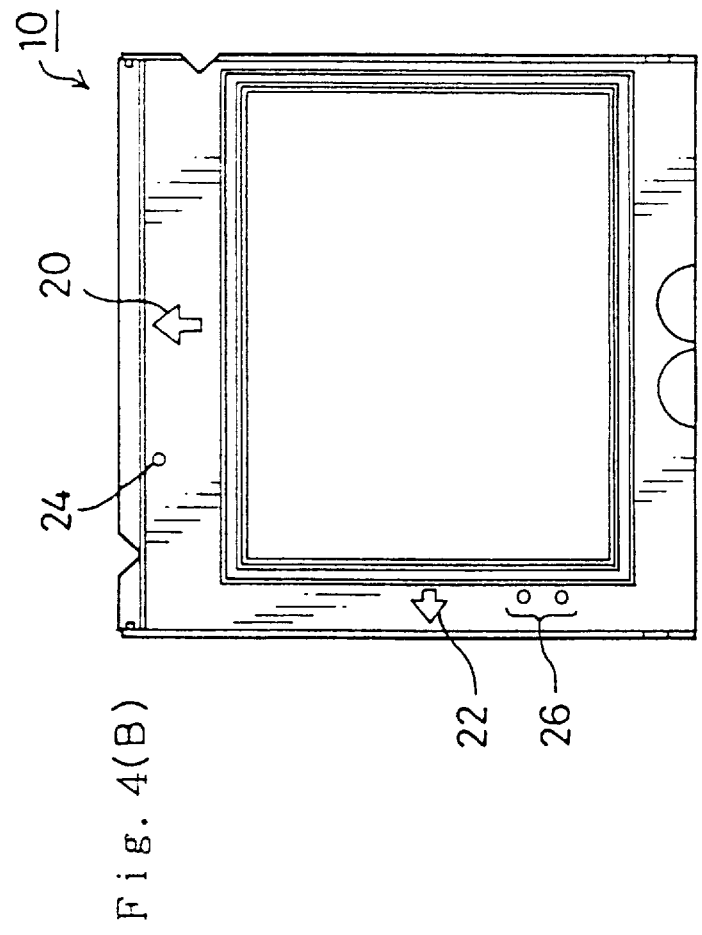
Figure 4C:
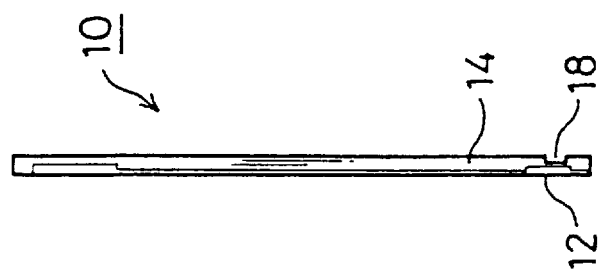

FIG. 3 is a perspective view illustrating an original holder 10 as a first embodiment according to the present invention, in an open state. FIG. 4 is plan, front, and side views illustrating the original holder 10 in a closed state. As illustrated in FIGS. 3 and 4, the original holder 10 includes a lower frame 12 and an upper frame 14, which are joined with each other to allow free opening and closing. The lower frame 12 and the upper frame 14 have inner openings 12W and 14W, respectively. The original holder 10 holds an original P in such a manner that the periphery of the original P is clamped between the lower frame 12 and the upper frame 14 and that the original P is observable through the openings 12W and 14W. The original P used herein is, for example, a 4"×5" film. The upper frame 14 is made of a transparent acrylic resin, whereas the lower frame 12 is composed of a colored acrylic resin.

Figure 5:
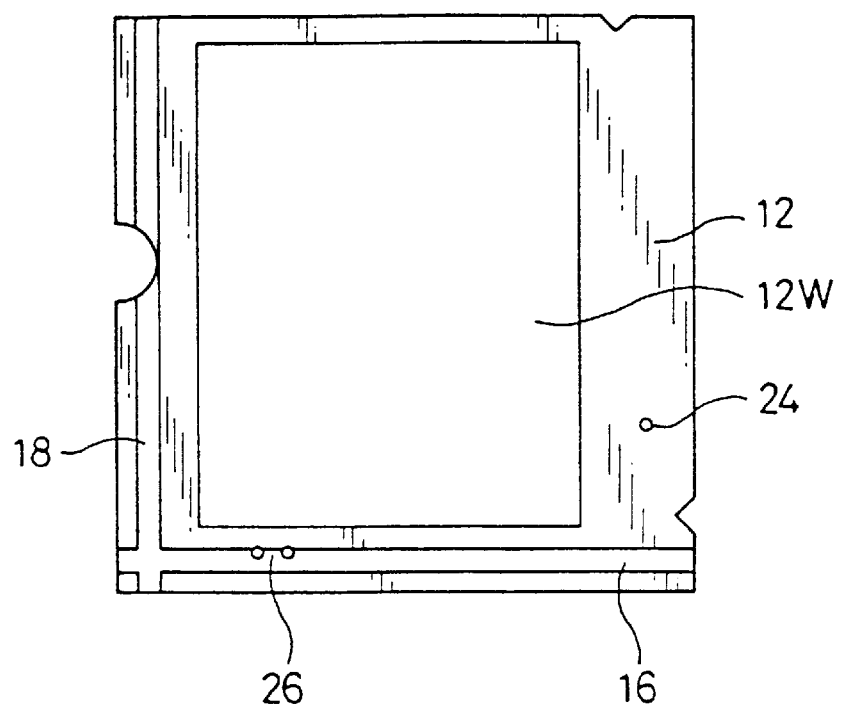
FIG. 5 is a bottom view illustrating the lower frame 12 of the original holder 10.

Referring to FIG. 4, the original holder 10 has a substantially square shape in the closed state. First and second guide grooves 16 and 18 functioning as corresponding engagement means are formed on a rear face of the lower frame 12 of the original holder 10 as clearly seen in FIG. 5. The first and the second guide grooves 16 and 18 are formed along two sides of the lower frame 12 perpendicular to each other, so as to restrict the insertion of the original holder 10 to two directions. A flat bed scanning-type image reading apparatus has a slot for receiving the original holder 10. The slot is provided with a projection member functioning as restriction means, which is engageable with the guide grooves 16 and 18 so as to allow the original holder 10 to be inserted into the slot in either one of the two restricted directions. The projection member interferes with the insertion of the original holder 10 into the slot in the directions other than the two restricted directions. The detailed structure of the flat bed scanning-type image reading apparatus with the projection member will be described later.

First and second arrows 20 and 22 representing the two restricted directions to allow insertion of the original holder 10 are inscribed on a surface of the upper frame 14. The lower frame 12 has first and second discrimination apertures 24 and 26 to specify the two restricted directions to allow insertion of the original holder 10. The first and the second discrimination apertures 24 and 26 are arranged at the equivalent positions relative to the two restricted directions of insertion. While the first discrimination aperture 24 consists of only one through hole, the second discrimination aperture 26 has two through holes.

The original P is held by the original holder 10 thus constructed. After the upper frame 14 of the original holder 10 is opened, the original P is placed over the opening 12W of the lower frame 12. The upper side of the original P is set corresponding to either the first discrimination aperture 24 or the second discrimination aperture 26. After the original P is set at the appropriate position, the upper frame 14 of the original holder 10 is closed.

Figure 1:
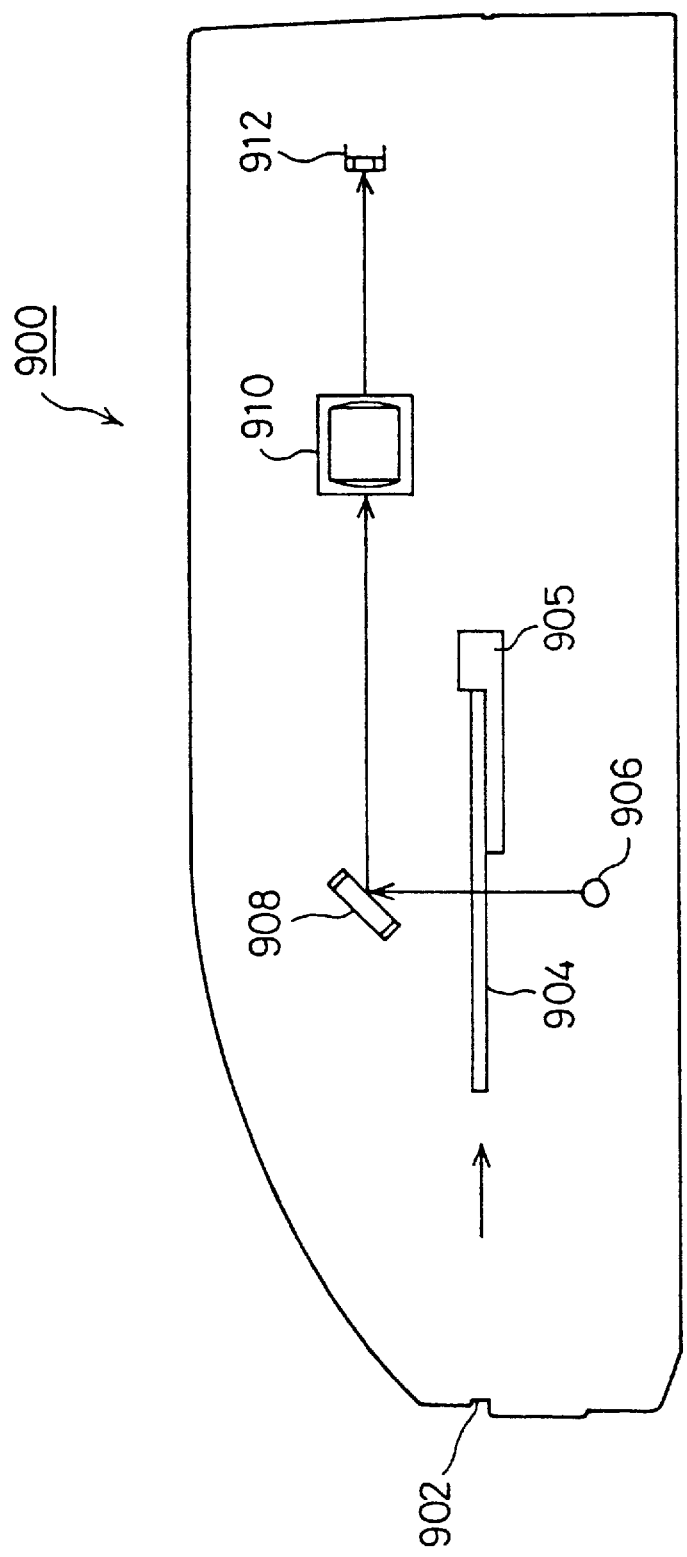
FIG. 1 is a side view schematically illustrating the internal structure of a typical flat bed scanning-type image reading apparatus 900.
Figure 2:
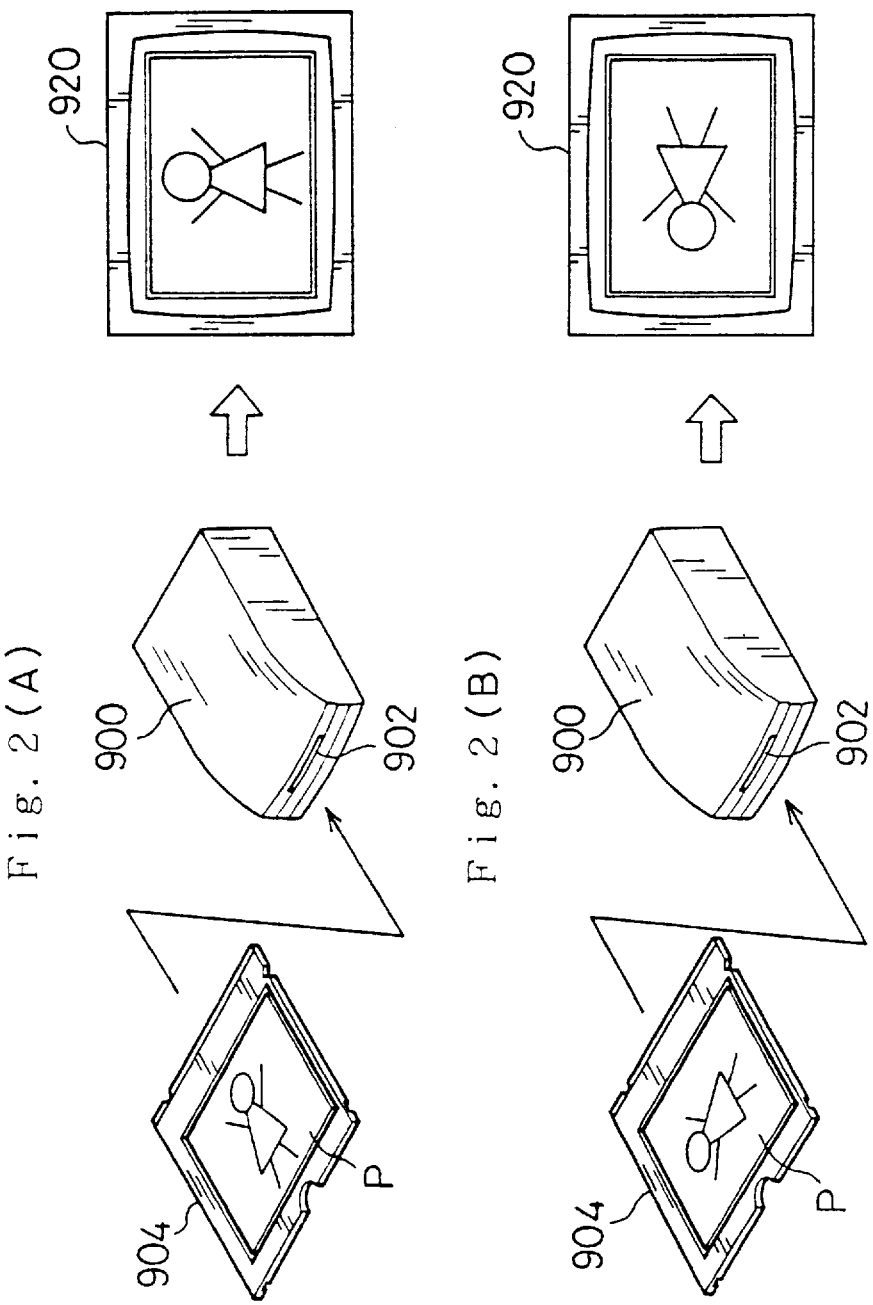
FIGS. 2(A) and 2(B) show resulting images displayed when a conventional original holder is inserted into the flat bed scanning-type image reading apparatus 900.
Figure 6:
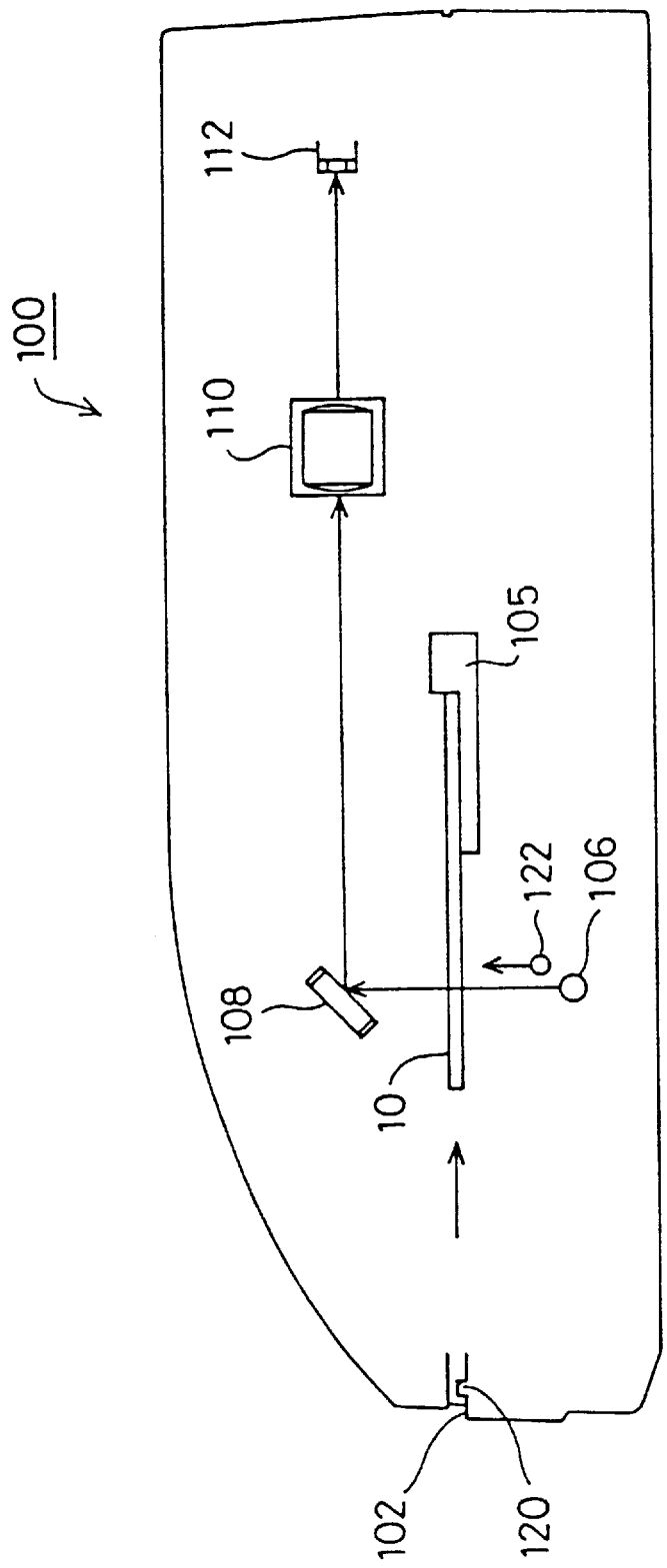
FIG. 6 is a side view schematically illustrating the internal structure of a flat bed scanner 100 used in the first embodiment.
Figure 7:
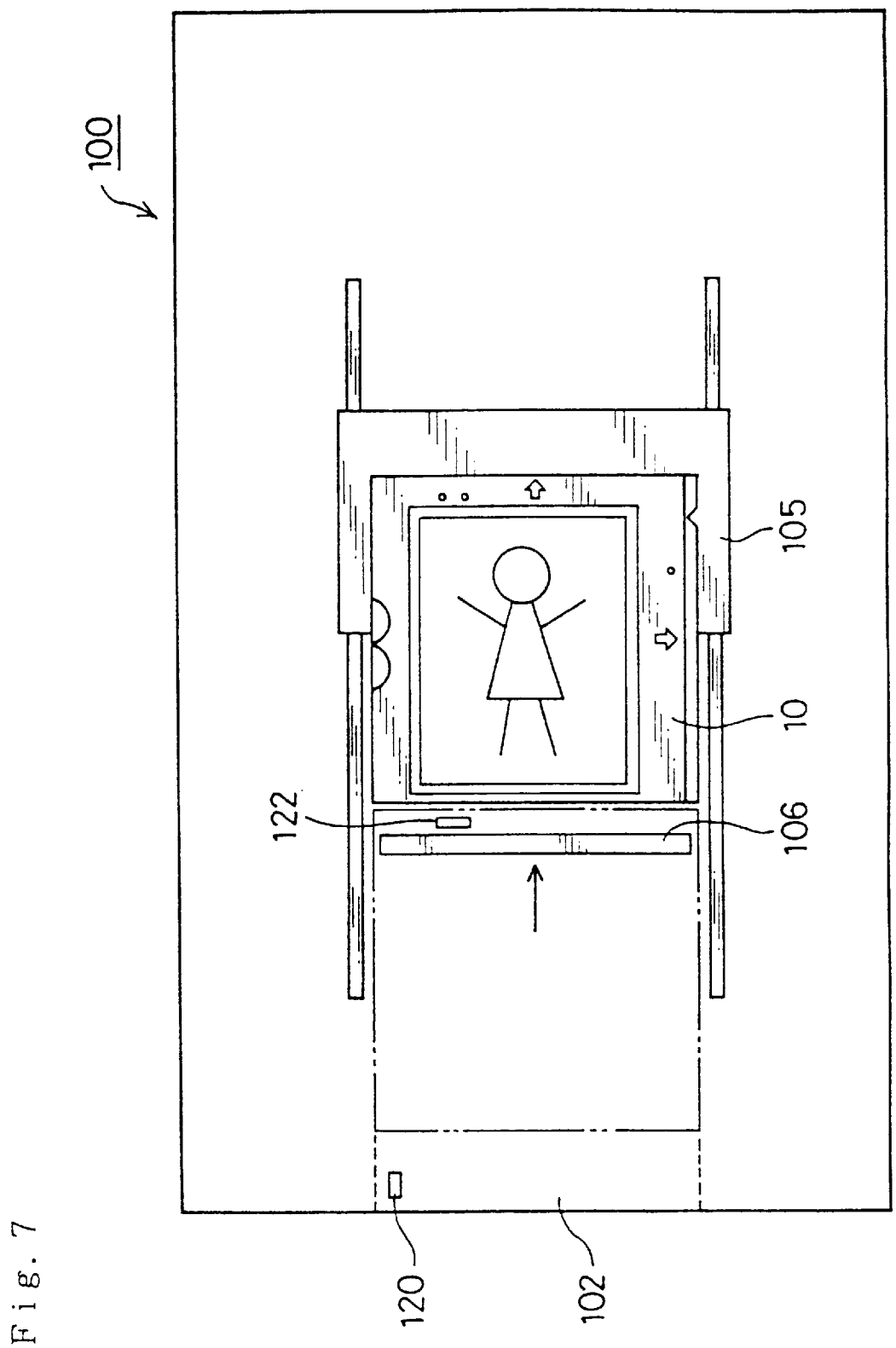
FIG. 7 is a plan view schematically illustrating the internal structure of the flat bed scanner 100.

The following describes the structure of a flat bed scanning-type image reading apparatus 100 (hereinafter referred to as flat bed scanner), into which the original holder 10 is inserted. FIG. 6 is a side view schematically illustrating the internal structure of the flat bed scanner 100 used in the first embodiment, and FIG. 7 is a plan view of the flat bed scanner 100. The flat bed scanner 100 includes the same constituents as those of the flat bed scanning-type image reading apparatus 900 shown in FIG. 1; a movable table 105, a light source 106, a folded mirror 108, a lens 110, and linear charge-coupled devices (hereinafter referred to as CCDs) 112. The flat bed scanner 100 further includes a projection member 120 formed in a slot 102 for receiving and engaging with the first and the second guide grooves 16 and 18 of the original holder 10, and a photo sensor 122 for optically reading discriminative information of the first discrimination aperture 24 or the second discrimination aperture 26 of the original holder 10. The projection member 120 is arranged at the right corner of the slot 102 (that is, at the left corner seen from the insertion direction of the original holder 10) as clearly shown in FIG. 7. The photo sensor 122 includes a light-emitting element and a light-receiving element, wherein the light-receiving element receives the reflection of light from the light-emitting element.

Figure 8A:
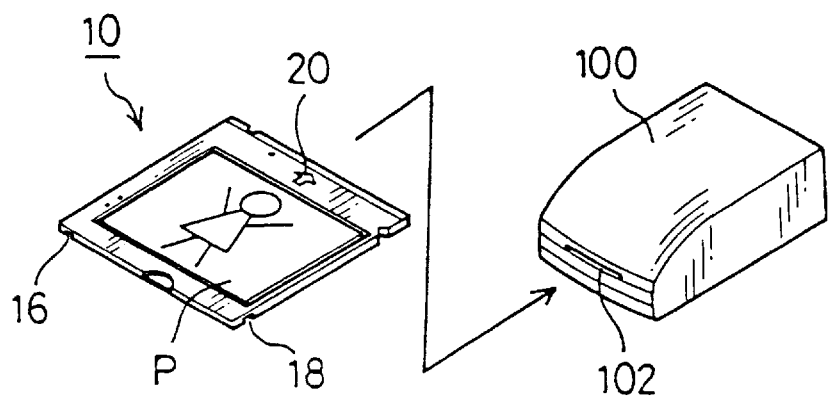
FIGS. 8(A) and 8(B) show the directions of insertion of the original holder 10 into the flat bed scanner 100.
Figure 8B:
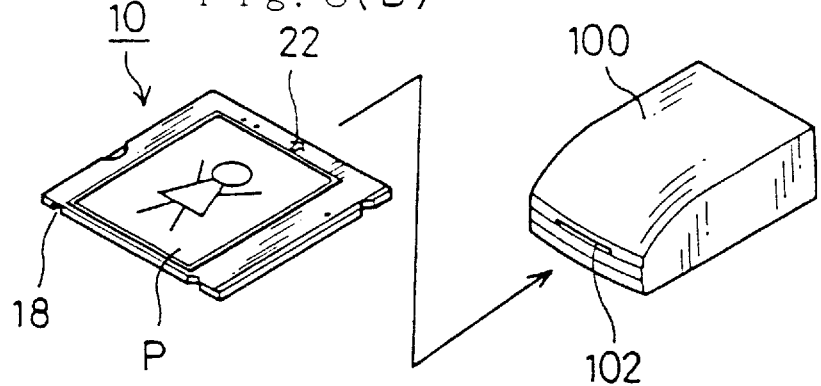

The original holder 10 with the original P held therein is inserted into the flat bed scanner 100 thus constructed. The original holder 10 is inserted into the flat bed scanner 100 in the direction of the first arrow 20 inscribed on the original holder 10 as shown in FIG. 8(A) or alternatively in the direction of the second arrow 22 inscribed on the original holder 10 as shown in FIG. 8(B). In the case of FIG. 8(A), the projection member 120 of the flat bed scanner 100 engages with the first guide groove 16 of the original holder 10. In the case of FIG. 8(B), on the other hand, the projection member 120 of the flat bed scanner 100 engages with the second guide groove 18 of the original holder 10. The directions of insertion of the original holder 10 shown in FIGS. 8(A) and 8(B) are referred to as the 0-degree direction of insertion and the 90-degree direction of insertion, respectively.

Figure 9:
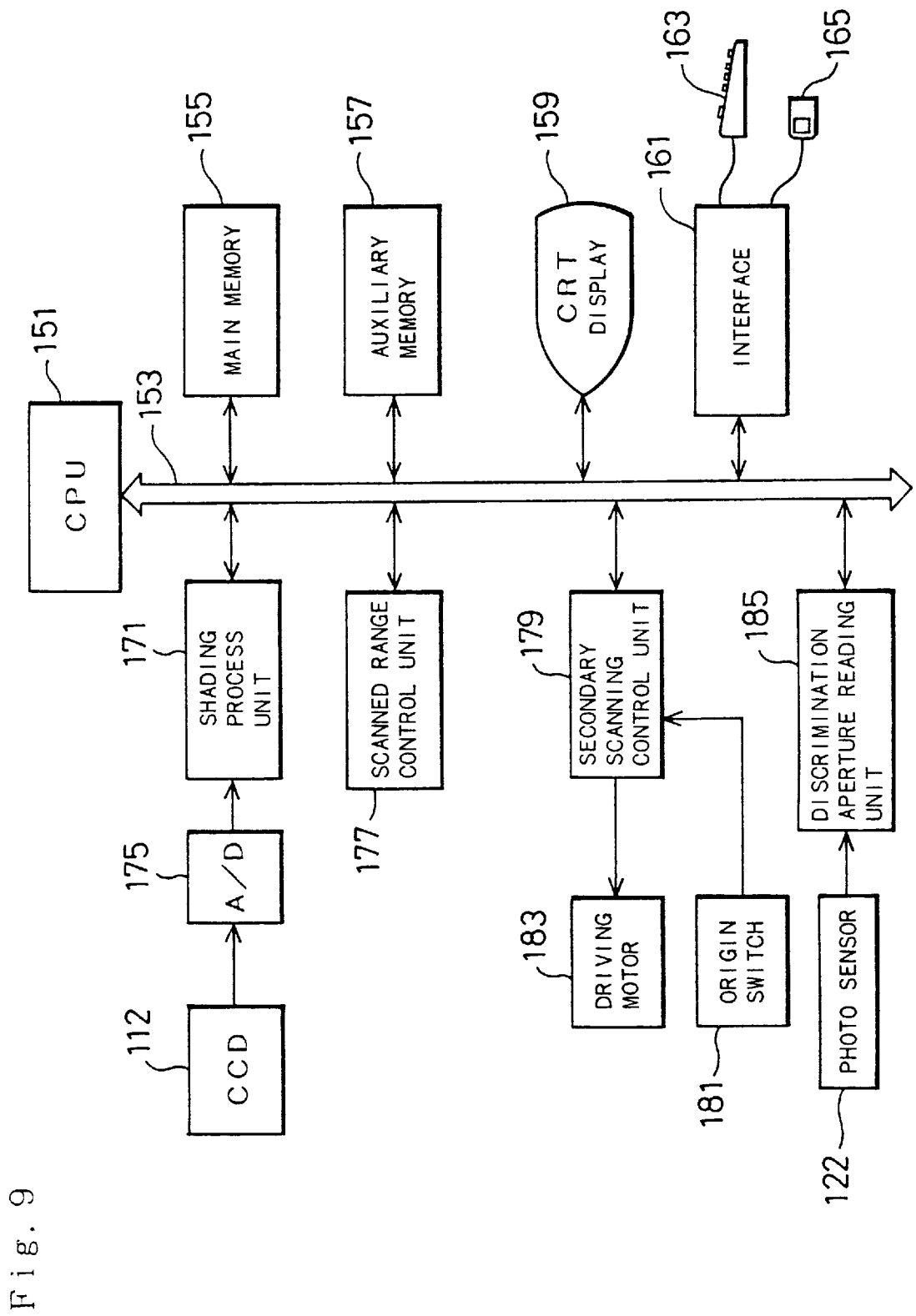
FIG. 9 is a block diagram showing the electrical structure of the flat bed scanner 100.

FIG. 9 is a block diagram showing the electrical structure of the flat bed scanner 100. The flat bed scanner 100 includes a CPU 151, a bus line 153, and the following constituents, which are connected to the CPU 151 via the bus line 153:

- a main memory 155 for storing a variety of process programs and working data;
- an auxiliary memory 157 for storing image data of a scanned original and other data required for the processing;
- a CRT display 159 for displaying an image based on the image data stored in the auxiliary memory 157;
- an interface 161 for connecting a keyboard 163 and a mouse 165 to the CPU 151;
- a shading process unit 171 for determining a scatter of the respective elements of the linear CCDs 112 and correcting the respective elements to give uniform outputs;
- an A-D converter 175 for converting analog signals from the linear CCDs 112 to digital signals and transmitting the digital signals to the shading process unit 171;
- a scanned range control unit 177 for controlling a scanned range of the original P set in the original holder 10;
- a secondary scanning control unit 179 for receiving detection signals from an origin switch 181, which determines whether the original holder 10 moved in a secondary scanning direction by the movable table 105 reaches a predetermined position of origin, and outputting control signals to a driving motor 183, which activates and drives the movable table 105; and a discrimination aperture reading unit 185 for activating the photo sensor 122 to read the number of through holes included in either the first discrimination aperture 24 or the second discrimination aperture 26 of the original holder 10.

Figure 10:
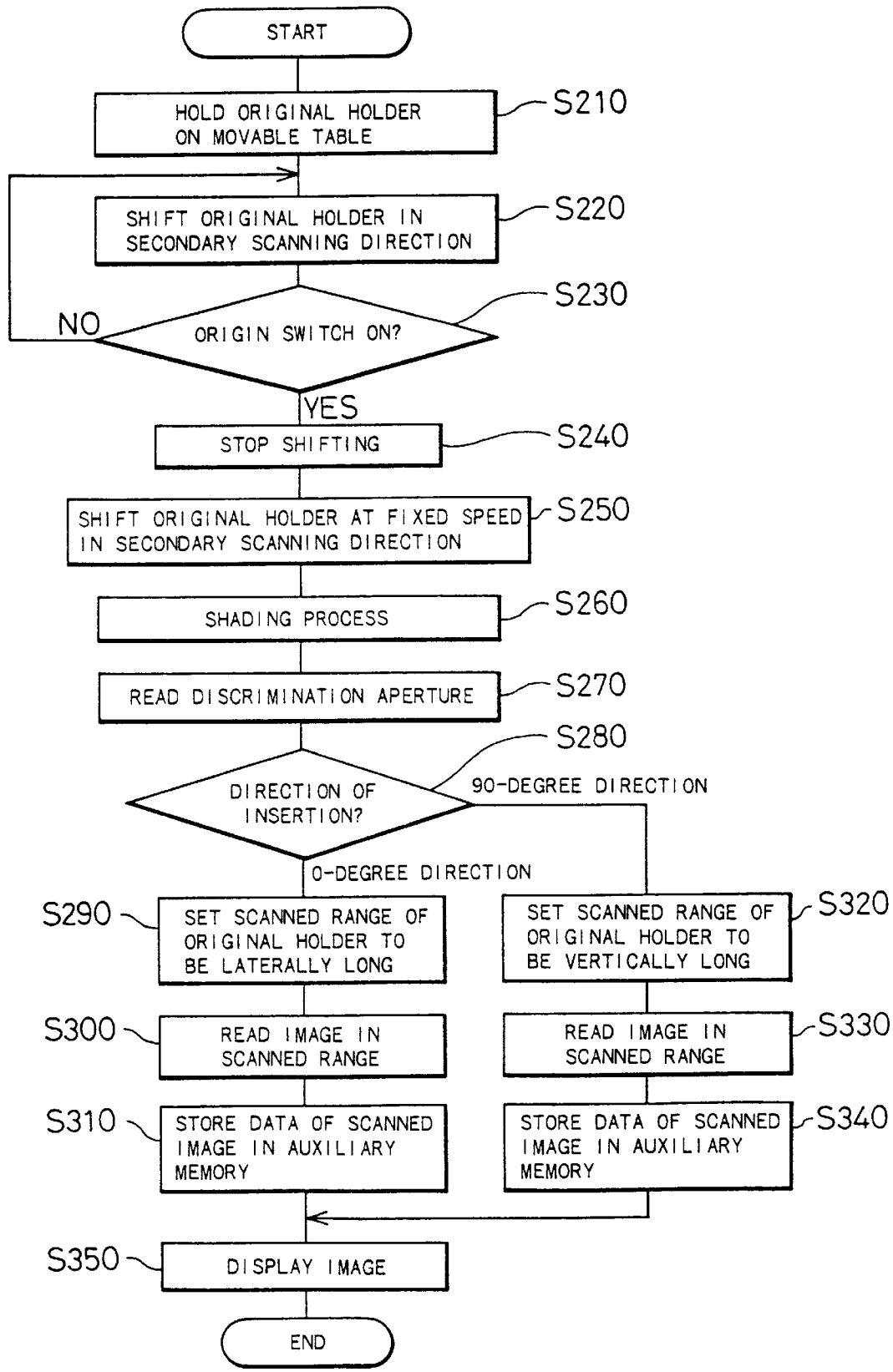
FIG. 10 is a flowchart showing an original image input routine executed by the CPU 151 of the flat bed scanner 100 in the first embodiment.

FIG. 10 is a flowchart showing an original image input routine executed by the CPU 151 of the flat bed scanner 100.

The program enters the routine when the original holder 10 with the original P set therein is inserted into the slot 102 of the flat bed scanner 100. The CPU 151 activates the movable table 105 to hold the inserted original holder 10 on the movable table 105 at step S210. The movable table 105 with the original holder 10 carried thereon is shifted in the secondary scanning direction (in the direction of the arrow in FIG. 6) at step S220, based on the control signals output from the secondary scanning control unit 179 to the driving motor 183. The program then proceeds to step S230 at which it is determined whether the origin switch 181 is turned ON, that is, it is determined whether the original holder 10 reaches the predetermined position of origin (the position defined by the two-dot chain lines in FIG. 7). The original holder 10 carried on the movable table 105 is continuously shifted in the secondary scanning direction until the original holder 10 reaches the predetermined position of origin.

When the origin switch 181 is turned ON, that is, when the original holder 10 is determined to reach the predetermined position of origin, at step S230, the original holder 10 is stopped temporarily at step S240. The program subsequently proceeds to step S250 at which the original holder 10 starts moving at a fixed speed in the secondary scanning direction.

The CPU 151 then activates the shading process unit 171 to make the respective elements of the linear CCDs 112 give uniform outputs at step S260. The shading process corrects the respective elements of the linear CCDs 112 to give uniform outputs, based on the scatter of the respective elements previously determined according to a black & white reference board.

The CPU 151 reads the number of through holes included in either the first discrimination aperture 24 or the second discrimination aperture 26 of the original holder 10 at step S270. Based on the number of through holes, the CPU 151 determines whether the insertion direction of the original holder 10 is the 0-degree direction or the 90-degree direction at step S280.

Figure 11A:
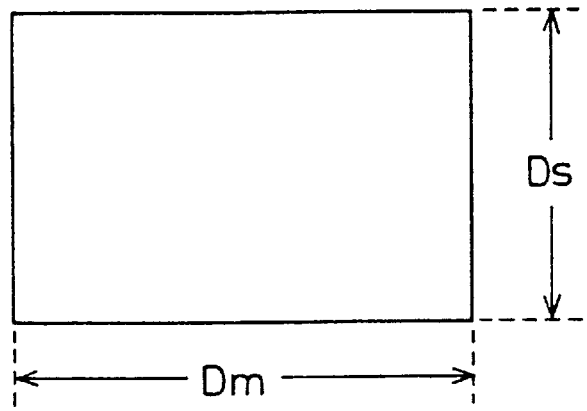
FIGS. 11(A) and 11(B) show scanned ranges according to the insertion direction of the original holder 10.

When the CPU 151 detects only one through hole indicating the 0-degree direction at step S280, the program proceeds to step S290, at which the scanned range of the original holder 10 is set to be a laterally long area having a width Dm in the primary scanning direction greater than a width Ds in the secondary scanning direction as shown in FIG. 11(A). The CPU 151 reads an image in the scanned range set at step S290 by means of the linear CCDs 112 at step S300 and stores image data representing the scanned image in the auxiliary memory 157 at step S310.

Figure 11B:
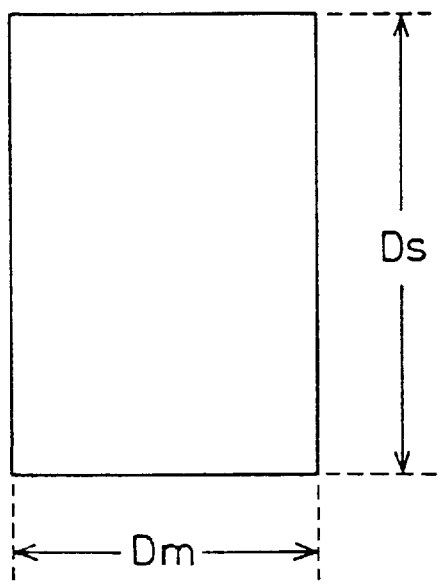

When the CPU 151 detects two through holes indicating the 90-degree direction at step S280, on the other hand, the program proceeds to step S320, at which the scanned range of the original holder 10 is set to be a vertically long area having the width Dm in the primary scanning direction less than the width Ds in the secondary scanning direction as shown in FIG. 11(B). The CPU 151 reads an image in the scanned range set at step S320 by means of the linear CCDs 112 at step S330 and stores image data representing the scanned image in the auxiliary memory 157 at step S340.

After the registration of image data into the auxiliary memory 157 at either step S310 or S340, the program goes to step S350 at which an image corresponding to the image data stored in the auxiliary memory 157 is displayed on the CRT display 159. After the display on the CRT display 159, the program goes to END and exits from the routine.

The process of the original image input routine gives a laterally long erecting image on the CRT display 159 as shown in FIG. 12(A), when the original holder 10 is inserted into the flat bed scanner 100 in the 0-degree direction as shown in FIG. 8(A). The process of the original image input routine gives a vertically long erecting image on the CRT display 159 as shown in FIG. 12(B), on the other hand, when the original holder 10 is inserted into the flat bed scanner 100 in the 90-degree direction as shown in FIG. 8(B).

The original holder 10 of the first embodiment can be inserted into the flat bed scanner 100 in the two different directions, that is, the 0-degree direction and the 90-degree direction. This structure allows both the laterally long image and the vertically long image to be displayed as an erecting image on the CRT display 159 only by inserting the original holder 10 in the appropriate direction into the flat bed scanner 100. The structure of the embodiment does not require any time-consuming electric or mechanical image rotations as the conventional system does, but promptly gives an erecting image. The flat bed scanner 100 of the embodiment does not include a rotary table for rotating the original holder 10, thereby being compactly designed.

The flat bed scanner 100 of the first embodiment determines the shape of the original P according to the insertion direction of the original holder 10 and sets the scanned range corresponding to the shape of the original P, thereby preventing useless image scanning in an unnecessary range. This improves the image reading speed in the flat bed scanner 100.

Although the two guide grooves 16 and 18 are formed on the original holder 10 in the first embodiment, four guide grooves may be formed along the respective sides of the original holder 10. The latter structure allows the original holder 10 to be inserted into the flat bed scanner 100 in the 180-degree direction and the 270-degree direction in addition to the 0-degree direction and the 90-degree direction. This structure gives an image of a desired direction with the higher degree of freedom.

In the structure of the first embodiment, the original holder 10 is inserted into the slot 102 of the flat bed scanner 100. According to another structure, the original holder 10 may be attached to an original attachment unit, for example, formed as a recess (not shown) of the flat bed scanner. In this alternative structure, the recess is provided with restriction means of a predetermined shape for restricting the insertion direction of the original holder, whereas the original holder is provided with a plurality of corresponding engagement means having a rotational symmetry by integral multiples of 90 degrees and having a specified shape engageable with the predetermined shape of the restriction means. This allows the original holder to be inserted in two or more different directions into the flat bed scanning-type image reading apparatus.

Figure 13:
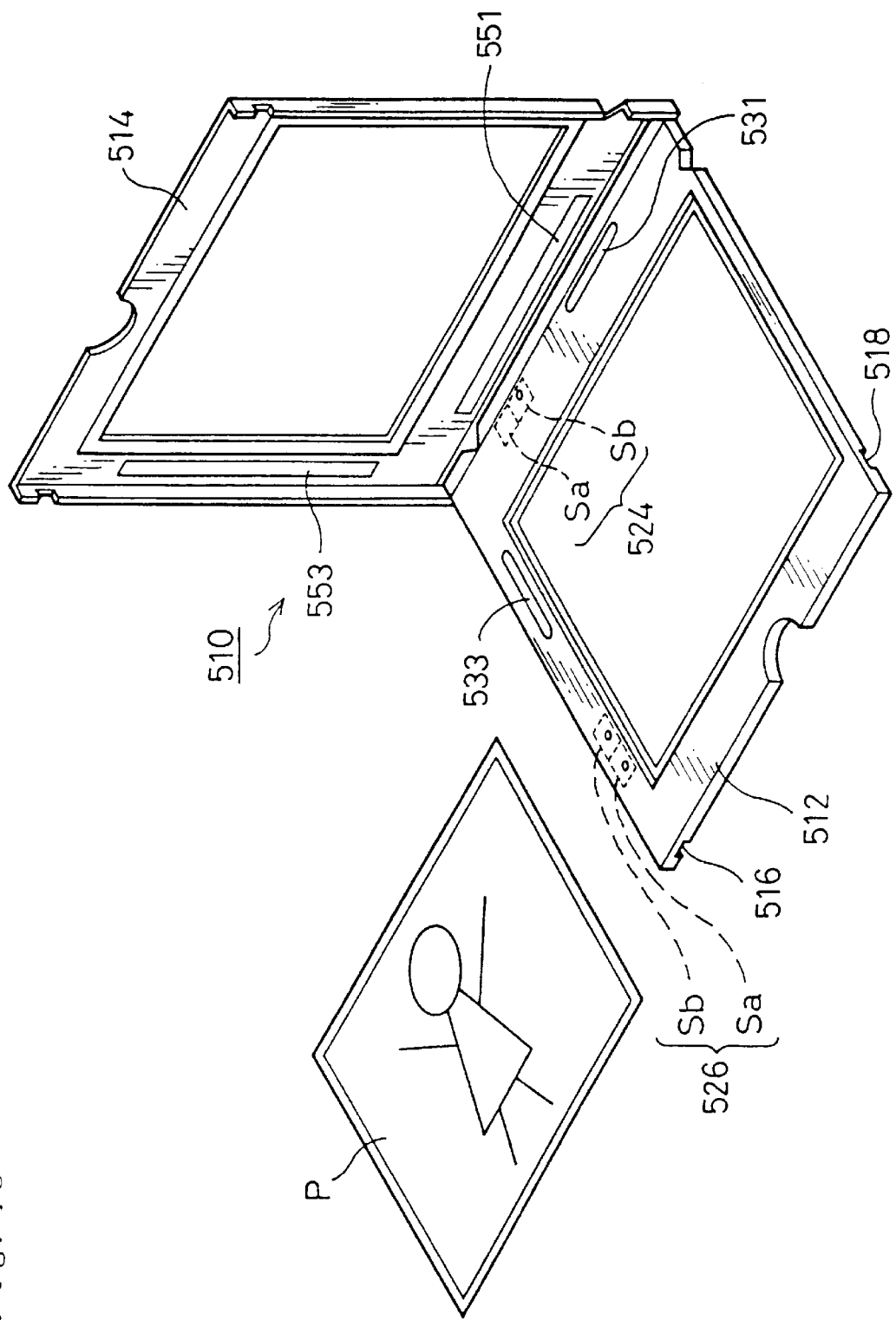
FIG. 13 is a perspective view illustrating another original holder 510 as a second embodiment according to the invention, in an open state.

FIG. 13 is a perspective view illustrating another original holder 510 as a second embodiment according to the invention, in an open state. FIG. 14 is plan, front, and side views illustrating the original holder 510 in a closed state. As illustrated in FIGS. 13 and 14, the original holder 510 of the second embodiment has a similar structure to that of the original holder 10 of the first embodiment, except first and second discrimination apertures 524 and 526 formed on a lower frame 512 of the original holder 510.

The first and the second discrimination apertures 24 and 26 of the first embodiment have different numbers of through holes to indicate one piece of discriminative information, that is, the insertion direction of the original holder 10. In the first and the second discrimination apertures 524 and 526 of the second embodiment, however, first and second through holes indicate different pieces of discriminative information.

Figure 15:
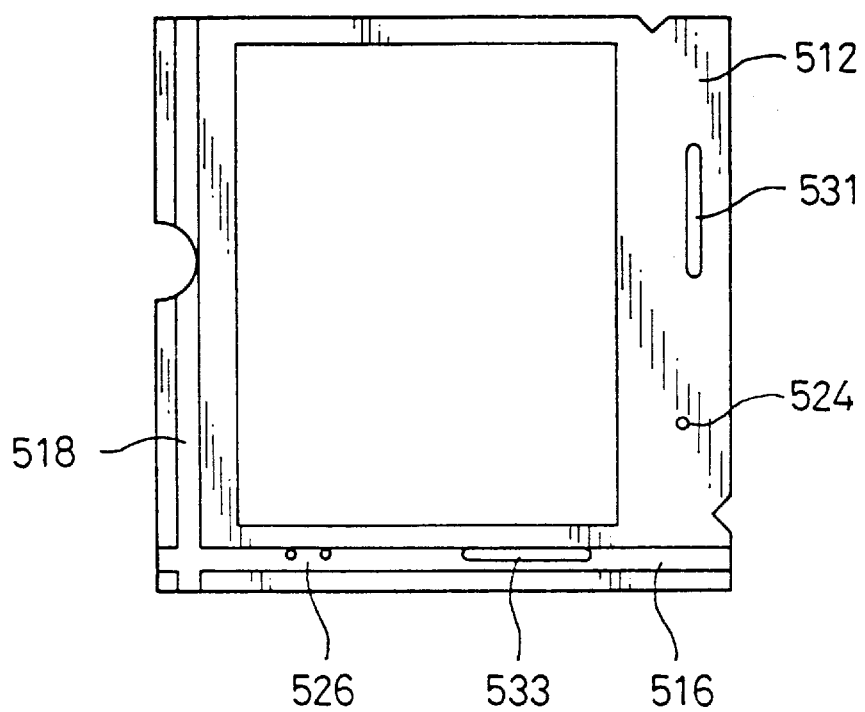
FIG. 15 is a bottom view illustrating the lower frame 512 of the original holder 510.

The first and the second discrimination apertures 524 and 526 are arranged at the equivalent positions relative to the respective directions of insertion. Each discrimination aperture 524 (or 526) consists of two hole areas Sa and Sb (see FIG. 13). The first hole area Sa indicates the insertion direction of the original holder 510. Existence of a through hole in the first hole area Sa shows that the insertion direction is defined by an arrow 522. Non-existence of a through hole in the first hole area Sa shows that the insertion direction is defined by an arrow 520. The second hole area Sb indicates the type of the original P. Existence of a through hole in the second hole area Sb shows that the original P is a 4"×5" film. Non-existence of a through hole in the second hole area Sb shows that the original P is a 35 mm×6 film. In the embodiment shown in FIGS. 13 through 15, the first discrimination aperture 524 has no through hole in the first hole area Sa and one through hole in the second hole area Sb, while the second discrimination aperture 526 has one through hole both in the first hole area Sa and the second hole area Sb.

The lower frame 512 is further provided with first and second slits 531 and 533. The first and the second slits 531 and 533 are covered in sealing members 540 (see FIG. 16) to specify an identification number given to the original holder 510. Like the first and the second discrimination apertures 524 and 526, the first and the second slits 531 and 533 are arranged at the equivalent positions relative to the respective directions of insertion. The first slit 531 is formed on one side of the lower frame 512 with the first discrimination aperture 524, and the second slit 533 on another side of the lower frame 512 with the second discrimination aperture 526.

Figure 16:
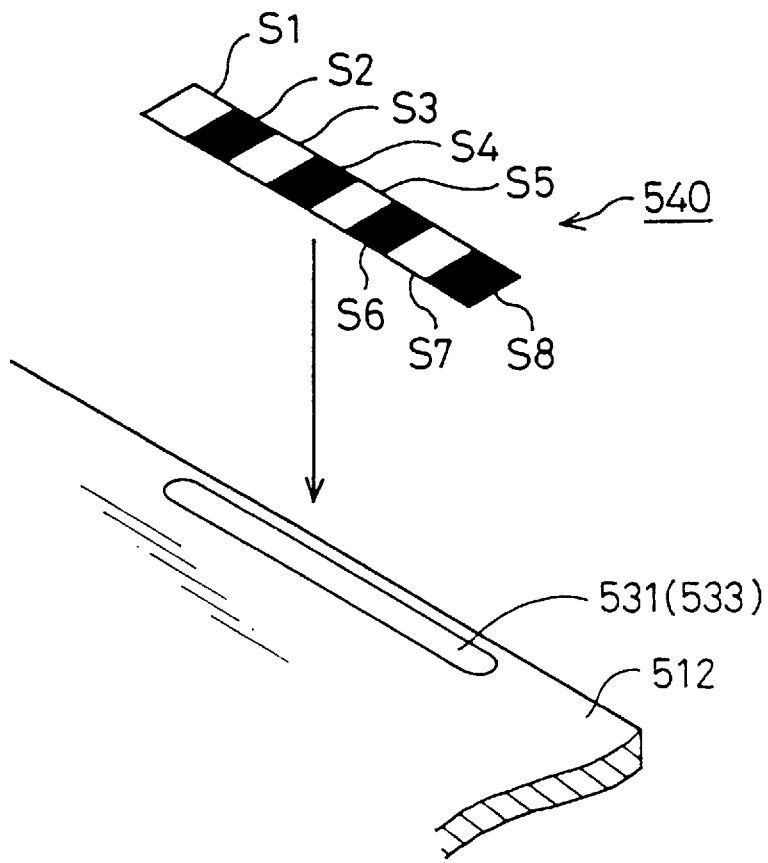
FIG. 16 is a perspective view illustrating a sealing member 540 attachable to a slit 531 (533)
Figure 17:
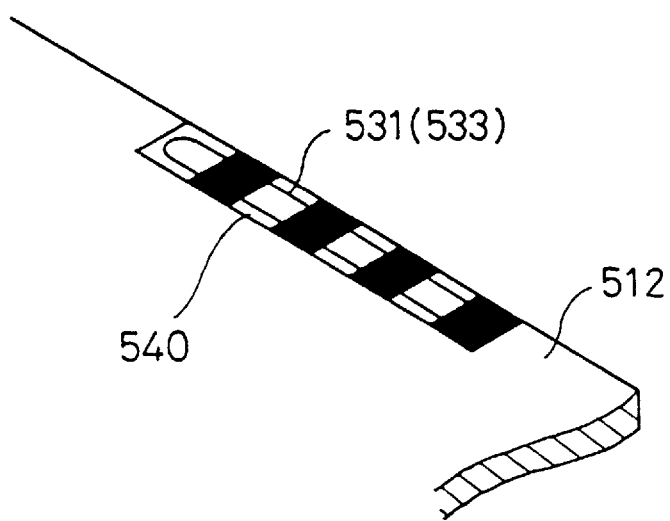
FIG. 17 is a perspective view illustrating the sealing member 540 attached to the slit 531 (533)

FIG. 16 is a perspective view illustrating the sealing member 540 adaptable to be attached to the first slit 531 and the second slit 533. The sealing member 540 is made of a poly(vinyl chloride) film and includes a plurality of black areas printed on the transparent sheet. The sealing member 540 is divided along its longitude into a plurality of equal areas; a total of eight areas, S1 to S8, in this embodiment. Some (may be one or plural) arbitrarily selected among the eight areas S1 to S8 are filled to the black areas. The sealing member 540 is attached over the slit 531 (533) to form an array of transparent (shown in white in the drawing) areas and black areas on the lower frame 512 as shown in FIG. 17. Like an array of plural holes, the array of transparent (white) areas and black areas determines a combination of light transmitting and shielding behaviors to indicate the identification number given to the original holder 510. In a concrete procedure, the transparent (white) areas indicate the numeral '0' and the black areas the numeral '1'. The identification number of the original holder 510 is accordingly expressed in binary notation.

An upper frame 514 has first and second transparent windows 551 and 553 (see FIGS. 13 and 14) to allow a set of the first discrimination aperture 524 and the first slit 531 and another set of the second discrimination aperture 526 and the second slit 533 to be optically readable in the state that the upper frame 514 and the lower frame 512 are closed. The transparent windows 551 and 553 are required when the upper frame 514 is composed of a colored material which does not sufficiently transmit light. The transparent upper frame 514 does not require such transparent windows.

Figure 18:
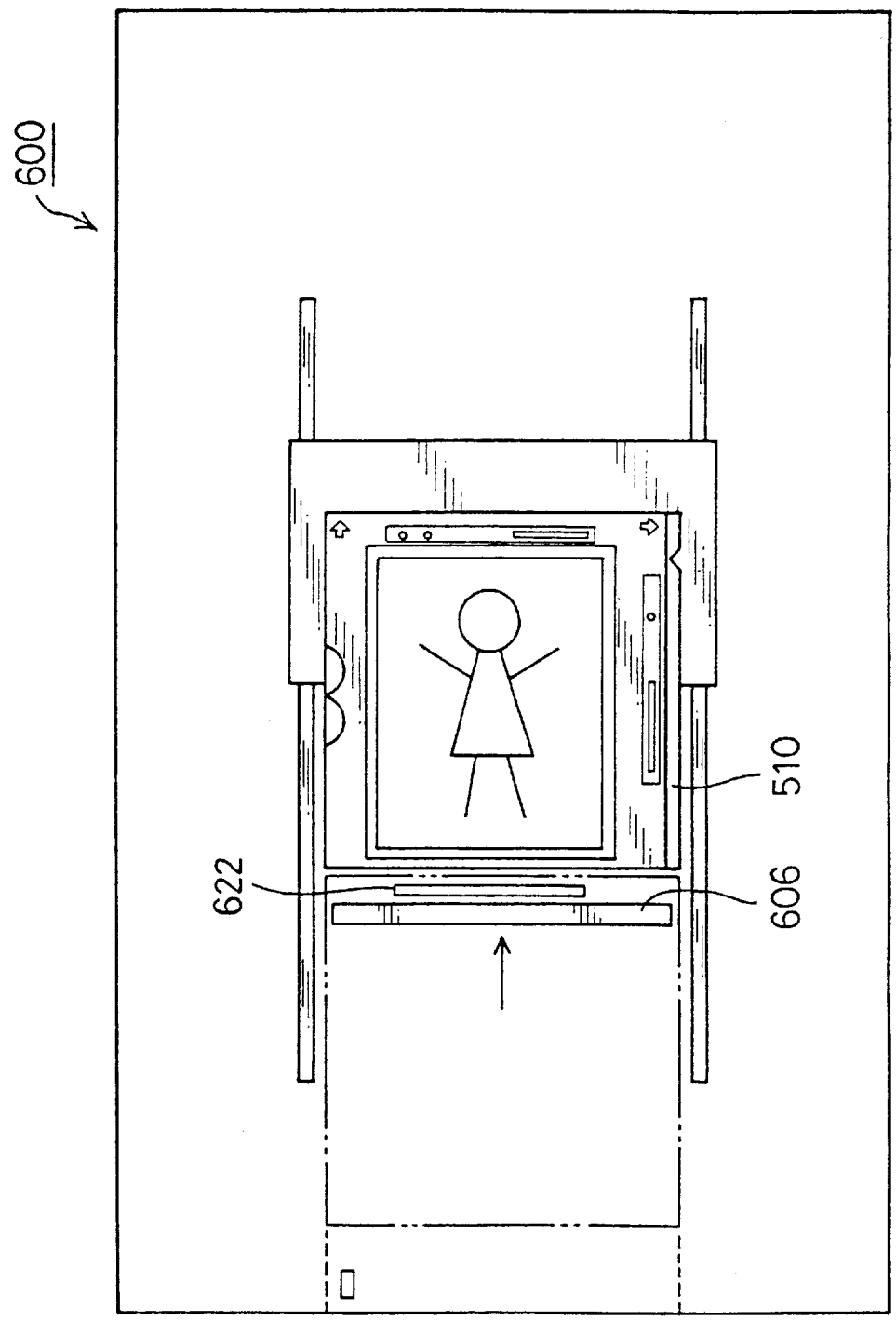
FIG. 18 is a plan view illustrating the internal structure of a flat bed scanner 600 used in the second embodiment.

The original holder 510 thus constructed is set in a flat bed scanner 600, which has a similar structure to that of the flat bed scanner 100 of the first embodiment, except the size of a photo sensor 622 as shown in the plan view of FIG. 18. While the short photo sensor 122 of the first embodiment reads discriminative information specified only by the discrimination aperture 24 (or 26), the long photo sensor 622 of the second embodiment reads discriminative information specified by both the discrimination aperture 524 (or 526) and the slit 531 (or 533).

Figure 19:
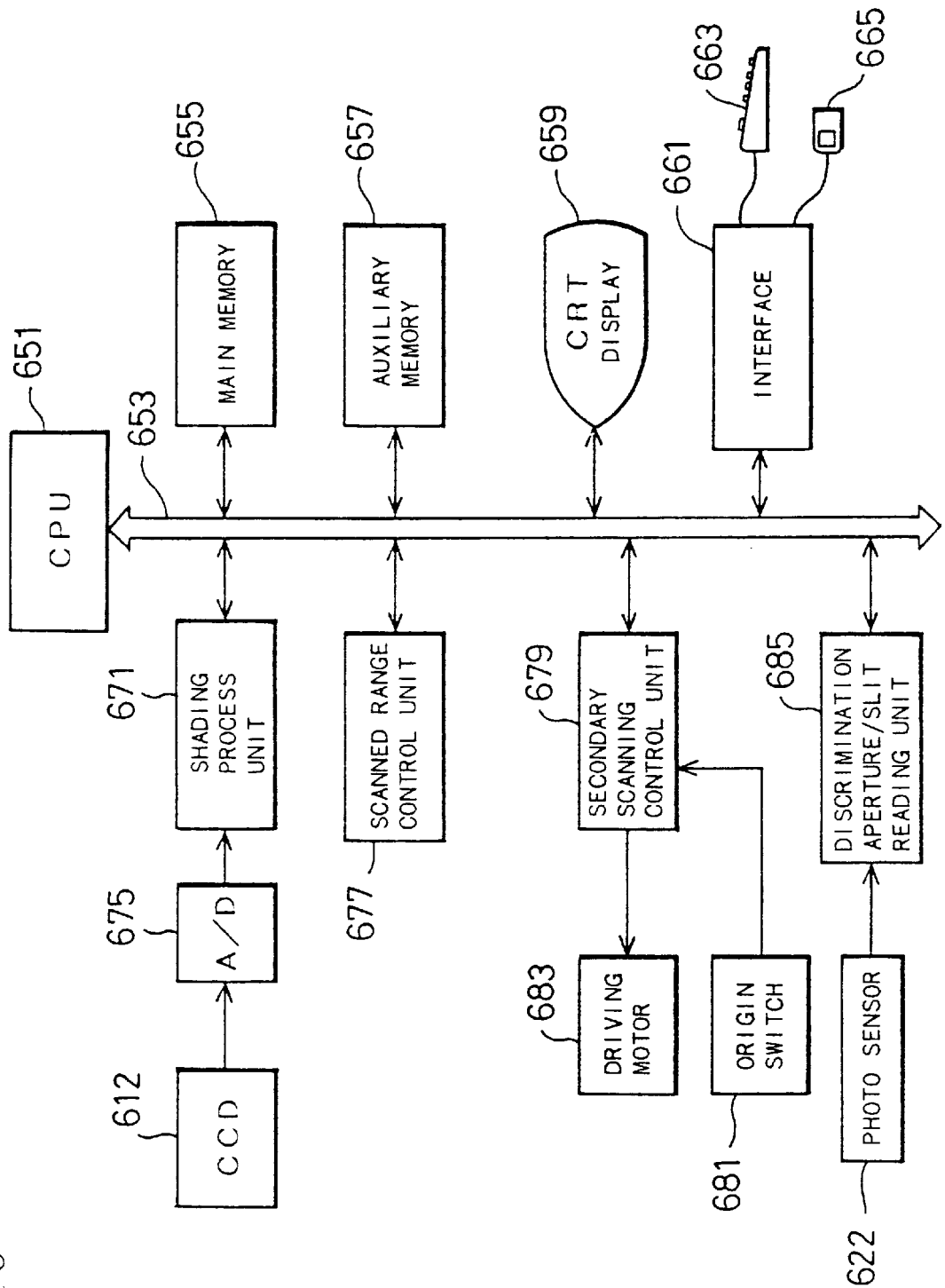
FIG. 19 is a block diagram showing the electrical structure of the flat bed scanner 600.

FIG. 19 is a block diagram showing the electrical structure of the flat bed scanner 600. The flat bed scanner 600 of the second embodiment has a similar electrical structure to that of the flat bed scanner 100 of the first embodiment, except a discrimination aperture/slit reading unit 685 connected to the photo sensor 622. The discrimination aperture/slit reading unit 685 activates the photo sensor 622 to read the arrays of through holes in the discrimination apertures 524 and 526 and the black and white arrays of the slits 531 and 533. The discrimination aperture/slit reading unit 685 is connected to a CPU 651 via a bus line 653.

Like the flat bed scanner 100 of the first embodiment, the flat bed scanner 600 of the second embodiment includes a main memory 655, an auxiliary memory 657, a CRT display 659, an interface 661, a keyboard 663, a mouse 665, linear CCDs 612, an A-D converter 675, a shading process unit 671, a scanned range control unit 677, an origin switch 681, a driving motor 683, and a secondary scanning control unit 679 other than the CPU 651 and the bus line 653.

Figure 20:
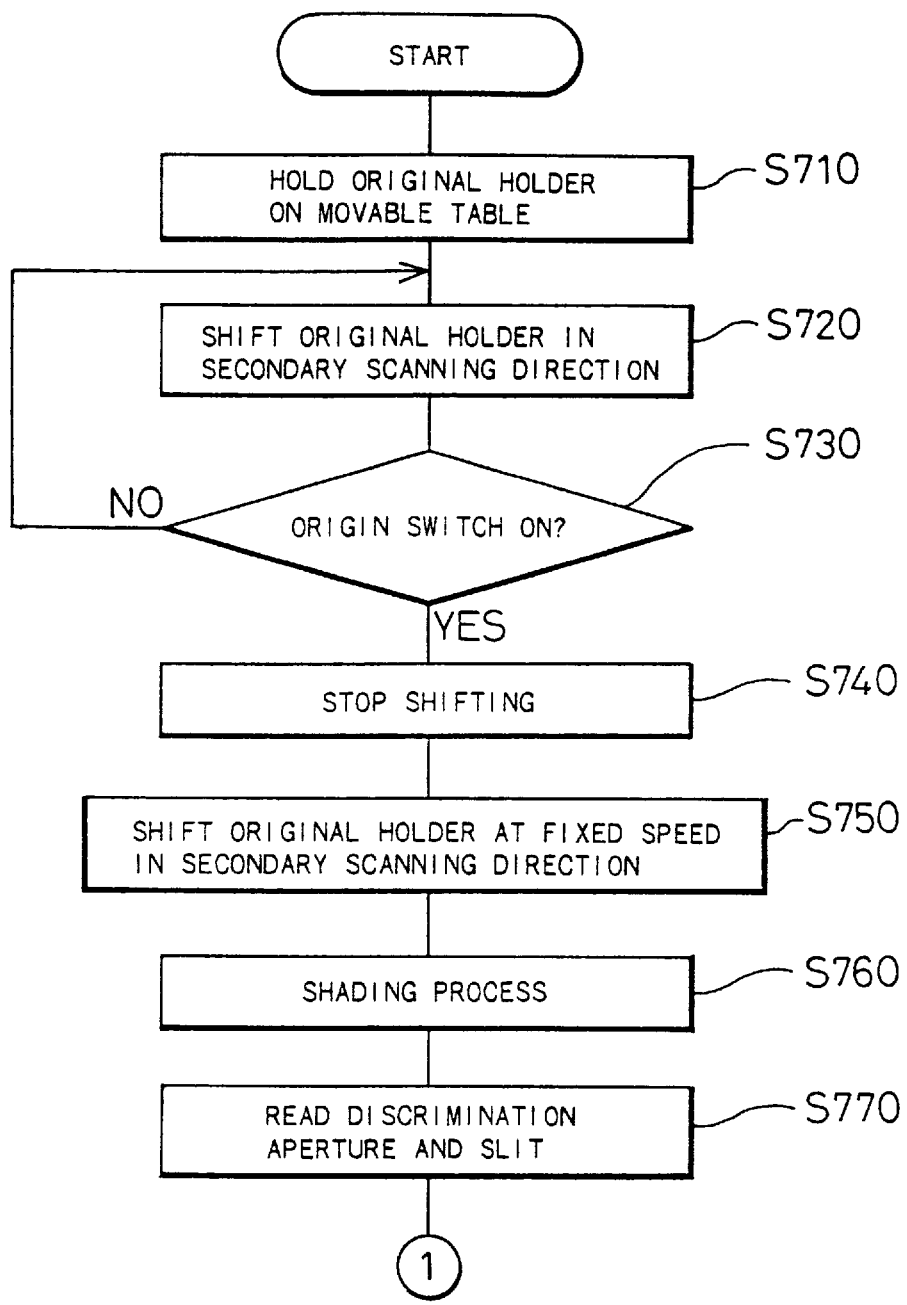
FIGS. 20 and 21 are flowcharts showing an original image input routine executed by the CPU 651 of the flat bed scanner 600 in the second embodiment.
Figure 21:
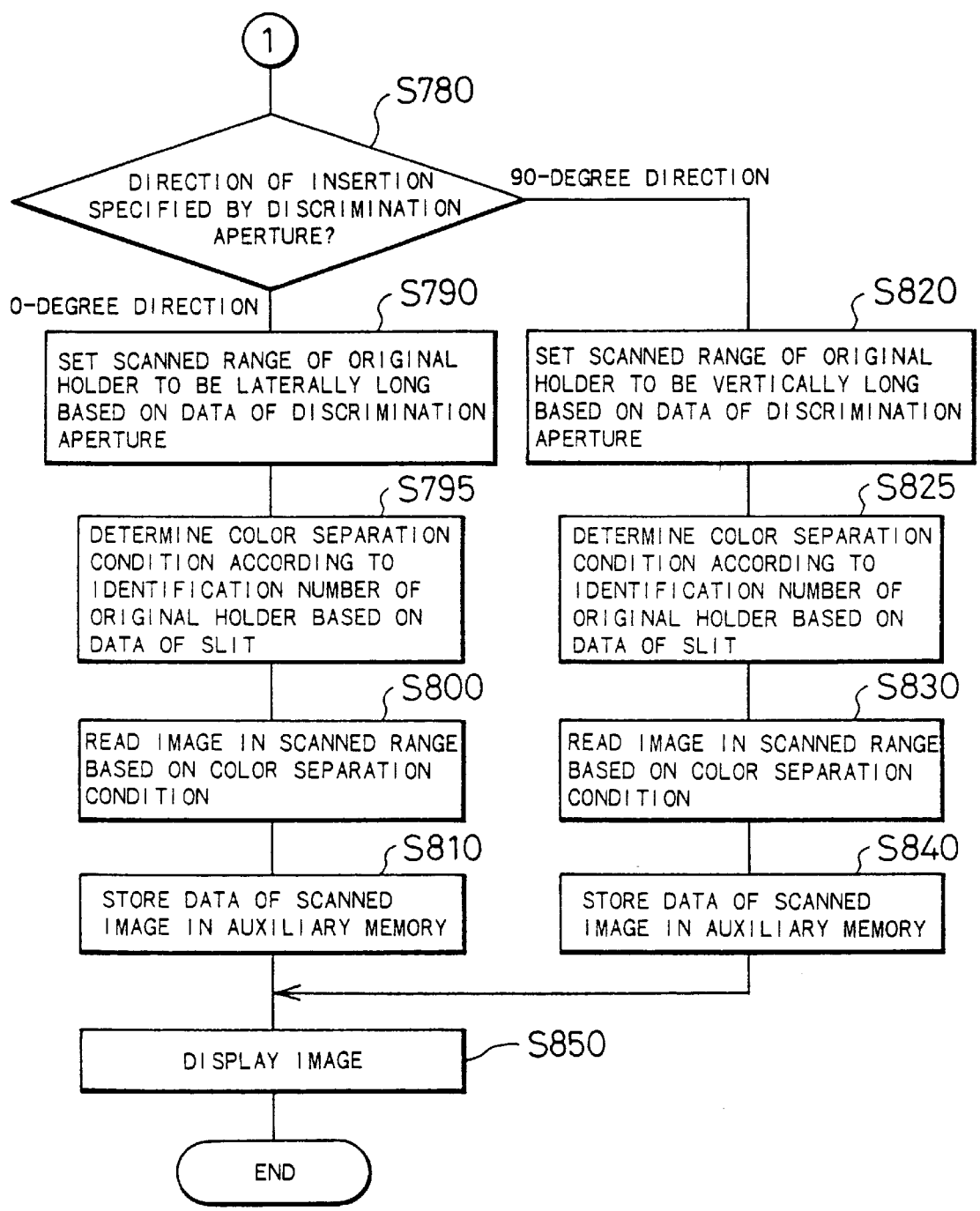

FIGS. 20 and 21 are flowcharts showing an original image input routine executed by the CPU 651 of the flat bed scanner 600 in the second embodiment.

The CPU 651 executes the processing at steps S710 through S760 in the flowchart of FIG. 20, which are identical with steps S210 through S260 in the flowchart of FIG. 10 of the first embodiment. At step S770, the CPU 651 reads the array of through holes in the discrimination aperture 524 (or 526) and the black and white array of the slit 531 (or 533) formed in the original holder 510.

The program then proceeds to step S780 in the flowchart of FIG. 21, at which the CPU 651 determines whether the insertion direction of the original holder 510 is the 0-degree direction or the 90-degree direction, based on the array of through holes in the discrimination aperture 524 (or 526) read at step S770 (more concretely, based on the existence or non-existence of a through hole in the first hole area Sa of the discrimination aperture 524 or 526).

Figure 22A:
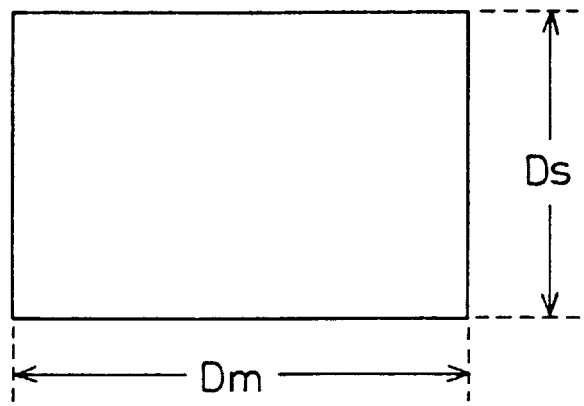
FIGS. 22(A) and 22(B) show scanned ranges according to the insertion direction of the original holder 510.

When the CPU 651 detects non-existence of a through hole in the first hole area Sa indicating the 0-degree direction at step S780, the program proceeds to step S790 at which the scanned range of the original holder 510 is set to be a laterally long area, based on the array of through holes in the first discrimination aperture 524 corresponding to the 0-degree direction read at step S770 (more concretely, based on the existence or non-existence of a through hole in the second hole area Sb). The laterally long area of the scanned range set at step S790 has a width Dm in the primary scanning direction greater than a width Ds in the secondary scanning direction as shown in FIG. 22(A). The size of the scanned range can be determined by the existence or non-existence of a through hole in the second hole area Sb since an original size table for specifying a plurality of sizes of the original P corresponding to the existence or non-existence of a through hole in the second hole area Sb has previously been stored in the auxiliary memory 657. The CPU 651 searches the original size table to determine the size of the scanned range corresponding to the existence or non-existence of a through hole in the second hole area Sb.

At step S795, the CPU 651 specifies the identification number of the original holder 510 based on the black and white array of the first slit 531 corresponding to the 0-degree direction read at step S770, and determines a color separation condition required for reading the original P according to the identification number. An original reading condition table showing the relationship between the identification numbers of the original holder 510 and the color separation conditions of the original P has previously been stored in the auxiliary memory 657. The CPU 651 searches the original reading condition table to determine the color separation condition of the original P corresponding to the identification number specified by the black and white array of the first slit 531 read at step S770.

The program proceeds to step S800 at which an image in the scanned range set at step S790 is read by means of the linear CCDs 612, based on the color separation condition determined at step S795. The CPU 651 subsequently stores image data representing the scanned image in the auxiliary memory 657 at step S810.

Figure 22B:
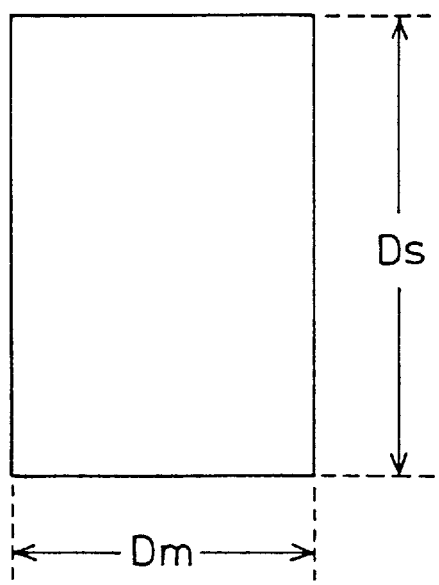

When the CPU 651 detects existence of a through hole in the first hole area Sa indicating the 90-degree direction at step S780, on the contrary, the program proceeds to step S820 at which the scanned range of the original holder 510 is set to be a vertically long area, based on the array of through holes in the second discrimination aperture 526 corresponding to the 90-degree direction read at step S770. The vertically long area of the scanned range set at step S820 has the width Dm in the primary scanning direction less than the width Ds in the secondary scanning direction as shown in FIG. 22(B).

In the same manner as step S795, the CPU 651 specifies the identification number of the original holder 510 based on the black and white array of the second slit 533 corresponding to the 90-degree direction read at step S770, and determines a color separation condition required for reading the original P according to the identification number at step S825. The program then proceeds to step S830 at which an image in the scanned range set at step S820 is read by means of the linear CCDs 612, based on the color separation condition determined at step S825. The CPU 651 subsequently stores image data representing the scanned image in the auxiliary memory 657 at step S840.

After the registration of image data into the auxiliary memory 657 at either step S810 or S840, the program goes to step S850 at which an image corresponding to the image data stored in the auxiliary memory 657 is displayed on the CRT display 659. After the display on the CRT display 659, the program goes to END and exits from the routine.

The process of the original image input routine gives a laterally long erecting image on the CRT display 659 when the original holder 510 is inserted into the flat bed scanner 600 in the 0-degree direction as shown in FIG. 23(A). The process of the original image input routine gives a vertically long erecting image on the CRT display 659, on the other hand, when the original holder 510 is inserted into the flat bed scanner 600 in the 90-degree direction as shown in FIG. 23(B).

The original holder 510 of the second embodiment can be inserted into the flat bed scanner 600 in the two different directions, that is, the 0-degree direction and the 90-degree direction. This structure allows both the laterally long image and the vertically long image to be displayed as an erecting image on the CRT display 659 only by inserting the original holder 510 in the appropriate direction into the flat bed scanner 600.

The original holder 510 of the second embodiment has the first and the second discrimination apertures 524 and 526 indicating the insertion direction of the original holder 510 and the type of the original P held in the original holder 510. The flat bed scanner 600 of the embodiment optically reads the discrimination aperture 524 (or 526) to determine the insertion direction of the original holder 510. The flat bed scanner 600 further determines the shape of the original P according to the insertion direction of the original holder 510 and automatically sets the scanned range corresponding to the shape of the original P. This structure does not require external inputs of discriminative information indicating the insertion direction of the original holder 510 and the type of the original P, thereby improving the operating properties of the flat bed scanner 600.

The original holder 510 of the second embodiment further includes the first and the second slits 531 and 533, to which the sealing member 540 indicating the identification number of the original holder 510 is attached. The flat bed scanner 600 reads the light transmitting pattern of the slit 531 (or 533) by means of the photo sensor 622 so as to specify the identification number of the original holder 510. The identification number of the original holder 510 gives information representing the color separation condition of the original P held in the original holder 510. This accordingly determines the optimum color separation condition for reading the original P, thereby further improving the operating properties of the flat bed scanner 600.

In the second embodiment, the identification number given to the original holder 510 is specified by the slits 531 and 533 and the sealing members 540 attached thereto. Each slit formed in the original holder 510 functions to discriminate the original holder 510 from others, and the same slit formed in a large number of original holders is accordingly used for their identification. A variety of combinations of the areas S1 through S8 on the sealing member 540 indicate 256 different pieces of discriminative information. The quantities of data can arbitrarily be increased by narrowing each area and increasing the total number of areas. The original holder 510 requires only one slit for the purpose of specifying the identification number. This simplifies the manufacturing process and effectively reduces the manufacturing cost.

The original holder 510 has the two slits 531 and 533 arranged at the equivalent positions relative to the respective directions of insertion. According to the insertion direction of the original holder 510 into the flat bed scanner 600, one photo sensor 622 sufficiently functions to detect the light transmitting pattern of either the first slit 531 or the second slit 533. This results in the reduced number of parts required for the flat bed scanner 600. A modified structure does not have the photo sensor 622 but utilizes the linear CCDs 612 for scanning an image on the original P as well as for reading the slits 531 and 533 and the discrimination apertures 524 and 526. This further reduces the required number of parts for the flat bed scanner 600.

Like the original holder 10 of the first embodiment, the original holder 510 of the second embodiment has two guide grooves 516 and 518. A total of four guide grooves may, however, be formed along the respective sides of the original holder 510. The latter structure allows the original holder 510 to be inserted into the flat bed scanner 600 in the 180-degree direction and the 270-degree direction in addition to the 0-degree direction and the 90-degree direction. This structure gives an image of a desired direction with the higher degree of freedom. In this case, four sets of slits and sealing members are preferably formed symmetrically about a point by integral multiples of 90 degrees. This allows one photo sensor 622 to detect the light transmitting patterns of the four slits.

Figure 24:
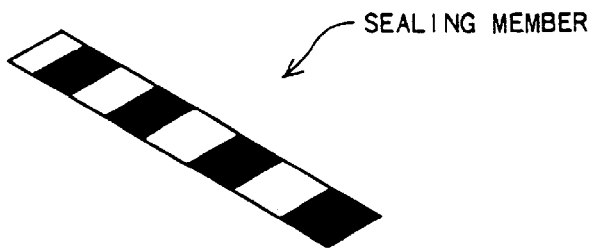
FIG. 24 is a perspective view illustrating another sealing member.
Figure 25:
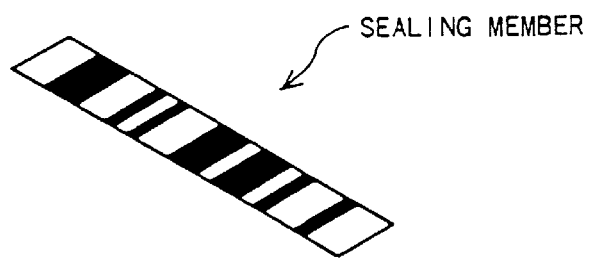
FIG. 25 is a perspective view illustrating still another sealing member.

In the sealing member 540 of the second embodiment, the transparent (white) or black areas S1 through S8 have an identical width. The sealing member may, however, have a plurality of areas of different widths as shown in FIG. 24 or have a plurality of narrower areas and a plurality of wider areas as shown in FIG. 25 to represent the numerals '0' and '1' in binary notation. The structure shown in FIG. 25 is equivalent to bar codes in the POS system. Any sealing member attached to one slit functions to specify discriminative information.

Figure 26:
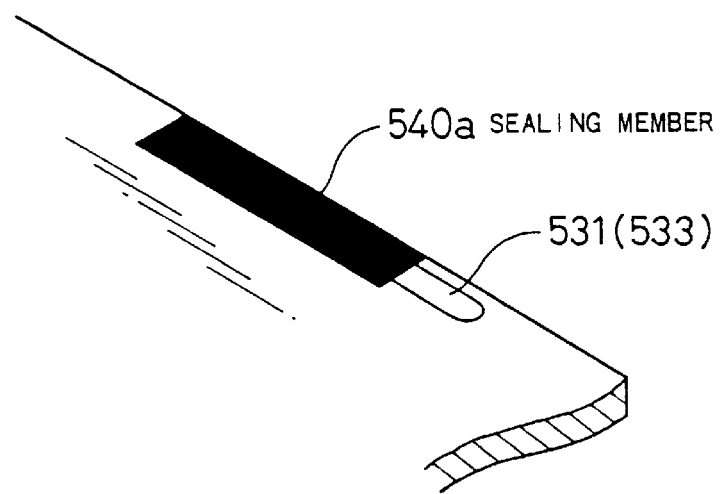
FIG. 26 is a perspective view illustrating another sealing member 540a attached to the slit 531 (533).

In another example of FIG. 26, a sealing member 540a is uniformly filled in black and has a varied length. This structure varies the opening area of each slit 531 or 533 for specifying discriminative information.

In the second embodiment, the discrimination apertures 524 and 526 indicate the insertion direction of the original holder 510 into the flat bed scanner 600 and the type of the original P held in the original holder 510, whereas the slits 531 and 533 and the sealing members 540 function to specify the identification number given to the original holder 510. According to a modified structure, the discrimination apertures 524 and 526 indicate only the insertion direction of the original holder 510 into the flat bed scanner 600, whereas the slits 531 and 533 and the sealing members 540 specify the type of the original P held in the original holder 510 and the identification number of the original holder 510. In this modified structure, the upper-most area S1 of the sealing member 540 specifies the type of the original P, and the subsequent areas S2 through S8 show the identification number given to the original holder 510. In another modified structure having no discrimination apertures 524,526, the slits 531,533 and the sealing members 540 function to determine the insertion direction of the original holder 510 into the flat bed scanner 600 and to specify the type of the original P held in the original holder 510 and the identification number of the original holder 510. In this case, the upper-most two areas S1 and S2 of the sealing member 540 specify the insertion direction and the type of the original P, and the subsequent areas S3 through S8 show the identification number of the original holder 510.

There may be many other modifications, alternations, and changes without departing from the scope or spirit of essential characteristics of the invention. It is thus clearly understood that the above embodiments are only illustrative and not restrictive in any sense. The scope and spirit of the present invention are limited only by the terms of the appended claims.

What is claimed is:

1. An original holder adaptable to be inserted into a slot of an image reading apparatus comprising restriction means of a predetermined shape for restricting insertion of said original holder into said slot, said original holder comprising:

a pair of support members having a substantially square shape and an opening, said pair of support members adaptable to hold an original therebetween when said pair of support members are in a closed state, said square shape having a first dimension of a side smaller than a second dimension of said slot; and a plurality of corresponding engagement means, provided to said pair of support members, for restricting insertion directions of said original holder into said image reading apparatus in cooperation with said restriction means, said plurality of corresponding engagement means having a rotational symmetry by integral multiples of 90 degrees, each said corresponding engagement means having a specified shape not interfering with said restriction means.

2. An original holder in accordance with claim 1, wherein each said corresponding engagement means comprises a groove engageable with a projection member functioning as said restriction means.

3. An original holder adaptable to be inserted into an image reading apparatus comprising restriction means of a predetermined shape for restricting insertion of said original holder into said image reading apparatus, said original holder comprising:

a pair of support members having a substantially square shape and an opening, said pair of support members adaptable to hold an original therebetween when said pair of support members are in a closed state;

a plurality of corresponding engagement means, provided to said pair of support members, for restricting insertion directions of said original holder into said image reading apparatus in cooperation with said restriction means, said plurality of corresponding engagement means having a rotational symmetry by integral multiples of 90 degrees, each said corresponding engagement means having a specified shape not interfering with said restriction means; and a plurality of marks indicating said insertion directions, said plurality of marks having a rotational symmetry by integral multiples of 90 degrees.

4. An original holder in accordance with claim 3, wherein each said mark comprises a light-transmitting indicator formed at said pair of support members to indicate each of said insertion directions.

5. An original holder for holding an original scanned by an image reading apparatus, said original holder comprising:

first and second support members adaptable to hold an original therebetween, said first support member having a slit, said second support member having a light-transmitting part adaptable to transmit through said slit; and a slit cover sheet adaptable to be attached to said slit to shield a part of said slit to make a light transmitting pattern, so as to specify a piece of discriminative information with said light transmitting pattern, wherein said first and second support members have a substantially square shape, said first support member comprising plural sets of said slit and said slit cover sheet, said plural sets of said slit and said slit cover sheet having a rotational symmetry by integral multiples of 90 degrees.

6. An original holder in accordance with claim 5, wherein said slit cover sheet comprises a shielding part including a plurality of black areas printed on a transparent sheet.

7. An original holder in accordance with claim 5, wherein said piece of discriminative information includes an identification number given to said original holder.

8. An original holder in accordance with claim 5, wherein said piece of discriminative information represents an insertion direction of said original holder into said image reading apparatus.

9. An original holder for holding an original scanned by an image reading apparatus, said original holder comprising:

first and second support members adaptable to hold an original therebetween, said first support member having a slit, said second support member having a light-transmitting part adaptable to transmit through said slit; and a slit cover sheet adaptable to be attached to said slit to shield a part of said slit to make a light transmitting pattern, so as to specify a piece of discriminative information with said light transmitting pattern, wherein said first and second support members having a substantially square shape, and said first support member comprising plural sets of said slit and said slit cover sheet.

10. An original holder adaptable to be inserted into a slot of an image reading apparatus restricting insertion of said original holder into said slot, said original holder comprising:

a pair of support members having a substantially square shape and an opening, said pair of support members adaptable to hold an original therebetween when said pair of support members are in a closed state;

a plurality of corresponding engagement mechanisms, provided to said pair of support members, restricting insertion directions of said original holder into said image reading apparatus and having a first rotational symmetry; and a plurality of marks indicating said insertion directions, said plurality of marks having a second rotational symmetry responsive to said first rotational symmetry.

11. An original holder adaptable to be inserted into a slot of an image reading apparatus restricting insertion of said original holder into said slot, said original holder comprising:

a pair of support members having a substantially square shape and an opening, said pair of support members adaptable to hold an original therebetween when said pair of support members are in a closed state; and first and second guide grooves provided on at least one of said pair of support members, guiding insertion directions of said original holder into said image reading apparatus, said first and second guide grooves being substantially perpendicular to each other and intersecting each other on a same or parallel plane.

* * * * *